United States Patent
Badre et al.

(10) Patent No.: US 9,552,903 B2
(45) Date of Patent: Jan. 24, 2017

(54) POLYMER COMPOSITIONS, POLYMER FILMS, POLYMER GELS, POLYMER FOAMS, AND ELECTRONIC DEVICES CONTAINING SUCH FILMS, GELS AND FOAMS

(71) Applicants: Rhodia Operations, Paris (FR); CENTRE NATIONAL DE LA RECHERCHE SCIENTIFIQUE, Paris (FR)

(72) Inventors: Chantal Badre, Millstone, NJ (US); Lawrence Hough, Philadelphia, PA (US); Ahmed Alsayed, Cherry Hill, NJ (US)

(73) Assignees: RHODIA OPERATIONS, Paris (FR); CENTRE NATIONALE DE LA RECHERCHE SCIENTIFIQUE, Paris (FR)

( * ) Notice: Subject to any disclaimer, the term of this patent is extended or adjusted under 35 U.S.C. 154(b) by 155 days.

(21) Appl. No.: 14/304,044

(22) Filed: Jun. 13, 2014

(65) Prior Publication Data
US 2014/0291584 A1    Oct. 2, 2014

Related U.S. Application Data

(62) Division of application No. 13/199,134, filed on Aug. 19, 2011, now Pat. No. 8,784,690.
(Continued)

(51) Int. Cl.
*H01B 1/00* (2006.01)
*B05D 5/12* (2006.01)
(Continued)

(52) U.S. Cl.
CPC .............. *H01B 1/127* (2013.01); *C08L 65/00* (2013.01); *H01B 1/122* (2013.01); *H01B 13/0026* (2013.01); *H01L 51/0035* (2013.01); *H01L 51/0036* (2013.01); *H01L 51/0037* (2013.01); *C08G 2261/1424* (2013.01);
(Continued)

(58) Field of Classification Search
CPC .. H01B 1/00; H01B 1/12; H01B 1/124–1/128; H01B 1/20; B05D 5/12
See application file for complete search history.

(56) References Cited

U.S. PATENT DOCUMENTS

| 4,933,106 A | 6/1990 | Sakai et al. |
| 4,959,430 A | 9/1990 | Jonas et al. |

(Continued)

FOREIGN PATENT DOCUMENTS

| EP | 2105458 | 9/2009 |
| WO | 2003087222 | 10/2003 |

(Continued)

OTHER PUBLICATIONS

Dobbelin et al "Influence of Ionic Liquids on the Electrical Conductivity and Morphology of PEDOT:PSS Films", Chem. Mater. 2007, 19, 2147-2149.*
(Continued)

*Primary Examiner* — Mark Kopec

(57) ABSTRACT

A polymer film, polymer gel, and polymer foam each contain an electrically conductive polymer and an ionic liquid and are each useful as a component of an electronic device.

2 Claims, 2 Drawing Sheets

Related U.S. Application Data

(60) Provisional application No. 61/401,856, filed on Aug. 20, 2010, provisional application No. 61/402,135, filed on Aug. 24, 2010, provisional application No. 61/571,568, filed on Jun. 30, 2011.

(51) Int. Cl.
*H01B 1/12* (2006.01)
*H01L 51/00* (2006.01)
*C08L 65/00* (2006.01)
*H01B 13/00* (2006.01)
*H01L 51/50* (2006.01)
*H01L 51/52* (2006.01)
*C08K 5/3445* (2006.01)

(52) U.S. Cl.
CPC . *C08G 2261/3223* (2013.01); *C08G 2261/51* (2013.01); *C08G 2261/794* (2013.01); *C08K 5/3445* (2013.01); *H01L 51/5088* (2013.01); *H01L 51/5206* (2013.01); *Y02E 10/549* (2013.01); *Y02P 70/521* (2015.11)

(56) References Cited

U.S. PATENT DOCUMENTS

| | | |
|---|---|---|
| 4,987,042 A | 1/1991 | Jonas et al. |
| 5,035,926 A | 7/1991 | Jonas et al. |
| 5,254,648 A | 10/1993 | Destryker et al. |
| 5,300,575 A | 4/1994 | Jonas et al. |
| 5,766,515 A | 6/1998 | Jonas et al. |
| 5,916,627 A | 6/1999 | Lessner et al. |
| 6,242,561 B1 | 6/2001 | Mohwald et al. |
| 6,391,379 B1 | 5/2002 | Lessner et al. |
| 6,589,593 B1 | 7/2003 | Hupe et al. |
| 6,605,823 B1 | 8/2003 | Pichler et al. |
| 6,632,472 B2 | 10/2003 | Louwet et al. |
| 6,635,729 B1 | 10/2003 | Groenendaal et al. |
| 6,692,662 B2 | 2/2004 | Haghighat et al. |
| 6,756,473 B2 | 6/2004 | Reuter et al. |
| 6,806,511 B2 | 10/2004 | Armgarth et al. |
| 6,850,003 B1 | 2/2005 | Pichler et al. |
| 6,855,951 B2 | 2/2005 | Ong et al. |
| 6,897,284 B2 | 5/2005 | Liu et al. |
| 6,936,761 B2 | 8/2005 | Pichler |
| 6,987,663 B2 | 1/2006 | Merker et al. |
| 6,995,223 B2 | 2/2006 | Groenendaal et al. |
| 7,005,088 B2 | 2/2006 | Zhang |
| 7,008,562 B2 | 3/2006 | Jonas et al. |
| 7,022,811 B2 | 4/2006 | Groenendaal et al. |
| 7,026,702 B2 | 4/2006 | Krieger et al. |
| 7,053,174 B2 | 5/2006 | Kirchmeyer et al. |
| 7,071,289 B2 | 7/2006 | Sotzing |
| 7,094,865 B2 | 8/2006 | Groenendaal et al. |
| 7,102,016 B2 | 9/2006 | Reuter |
| 7,105,854 B2 | 9/2006 | Sirringhaus et al. |
| 7,112,368 B2 | 9/2006 | Hsu |
| 7,147,936 B2 | 12/2006 | Louwet et al. |
| 7,223,357 B2 | 5/2007 | Tahon et al. |
| 7,250,461 B2 | 7/2007 | Hsu et al. |
| 7,306,823 B2 | 12/2007 | Sager et al. |
| 7,317,047 B2 | 1/2008 | Hsu |
| 7,317,048 B2 | 1/2008 | Zhang |
| 7,318,904 B2 | 1/2008 | Wang et al. |
| 7,338,620 B2 | 3/2008 | Hsu et al. |
| 7,361,728 B1 | 4/2008 | Elliott et al. |
| 7,378,126 B2 | 5/2008 | Yamazaki et al. |
| 7,390,438 B2 | 6/2008 | Hsu et al. |
| 7,393,727 B2 | 7/2008 | Hirai |
| 7,422,790 B1 | 9/2008 | Scher et al. |
| 7,431,866 B2 | 10/2008 | Hsu et al. |
| 7,438,832 B2 | 10/2008 | Majumdar et al. |
| 7,455,793 B2 | 11/2008 | Hsu et al. |
| 7,470,604 B2 | 12/2008 | Fujii |
| 7,569,158 B2 | 8/2009 | Waller et al. |
| 7,585,983 B2 | 9/2009 | Reuter et al. |
| 7,618,559 B2 | 11/2009 | Yoshida et al. |
| 7,638,072 B2 | 12/2009 | Hsu et al. |
| 7,683,109 B2 | 3/2010 | Yoshida et al. |
| 7,684,172 B2 | 3/2010 | Kasuga et al. |
| 7,708,908 B2 | 5/2010 | Kim et al. |
| 7,733,000 B2 | 6/2010 | Kudoh |
| 7,736,489 B2 | 6/2010 | Hennerdal et al. |
| 7,745,520 B2 | 6/2010 | Shao et al. |
| 7,750,099 B2 | 7/2010 | Chigusa et al. |
| 7,763,382 B2 | 7/2010 | Riley et al. |
| 7,781,761 B2 | 8/2010 | Meng |
| 7,785,493 B2 | 8/2010 | Jonas et al. |
| 7,820,078 B2 | 10/2010 | Louwet |
| 7,842,197 B2 | 11/2010 | Kitamura |
| 7,863,600 B2 | 1/2011 | Nomoto |
| 7,932,320 B2 | 4/2011 | Louwet et al. |
| 7,960,566 B2 | 6/2011 | Ogita et al. |
| 7,968,383 B2 | 6/2011 | Honda et al. |
| 7,973,180 B2 | 7/2011 | Morita et al. |
| 7,976,736 B2 | 7/2011 | Boll et al. |
| 7,985,527 B2 | 7/2011 | Tokunaga |
| 7,990,684 B2 | 8/2011 | Sugihara et al. |
| 7,998,363 B2 | 8/2011 | Park et al. |
| 8,005,526 B2 | 8/2011 | Martin et al. |
| 8,035,952 B2 | 10/2011 | Yoshida et al. |
| 8,089,681 B2 | 1/2012 | Wu et al. |
| 8,097,184 B2 | 1/2012 | Yoshida et al. |
| 8,101,097 B2 | 1/2012 | Bahnmuller et al. |
| 8,110,122 B2 | 2/2012 | Kawakami et al. |
| 8,114,318 B2 | 2/2012 | Kuang et al. |
| 8,115,984 B2 | 2/2012 | Agrawal et al. |
| 8,130,438 B2 | 3/2012 | Agrawal et al. |
| 8,137,767 B2 | 3/2012 | Inoue et al. |
| 8,142,909 B2 | 3/2012 | Beers et al. |
| 8,183,319 B2 | 5/2012 | Han-Adebekun |
| 8,193,442 B2 | 6/2012 | Sager et al. |
| 8,206,838 B2 | 6/2012 | Marrocco et al. |
| 8,222,077 B2 | 7/2012 | Gong et al. |
| 8,227,293 B2 | 7/2012 | Bressers et al. |
| 8,232,561 B2 | 7/2012 | Rinzler et al. |
| 8,257,562 B2 | 9/2012 | Isaksson et al. |
| 8,258,500 B2 | 9/2012 | Duerr et al. |
| 8,268,195 B2 | 9/2012 | Zheng et al. |
| 8,283,055 B2 | 10/2012 | Seo et al. |
| 8,283,657 B2 | 10/2012 | La Rosa et al. |
| 8,294,025 B2 | 10/2012 | Fonash et al. |
| 8,323,744 B2 | 12/2012 | Connor et al. |
| 8,334,331 B2 | 12/2012 | Elschner et al. |
| 8,339,770 B2 | 12/2012 | Yoshida et al. |
| 8,367,839 B2 | 2/2013 | Li et al. |
| 8,493,713 B2 | 7/2013 | Biler et al. |
| 2002/0177039 A1 | 11/2002 | Lu et al. |
| 2003/0161941 A1 | 8/2003 | Kirchmeyer et al. |
| 2004/0089849 A1 | 5/2004 | Osherov et al. |
| 2004/0152832 A1 | 8/2004 | Kirchmeyer et al. |
| 2005/0016578 A1 | 1/2005 | Enomoto et al. |
| 2006/0065889 A1 | 3/2006 | Allemand |
| 2006/0203322 A1 | 9/2006 | Radmard et al. |
| 2006/0226396 A1 | 10/2006 | Majumdar et al. |
| 2006/0266642 A1 | 11/2006 | Akle et al. |
| 2007/0020479 A1 | 1/2007 | Uetani et al. |
| 2007/0085061 A1 | 4/2007 | Elder et al. |
| 2007/0115762 A1 | 5/2007 | Wisnudel et al. |
| 2007/0131910 A1 | 6/2007 | Daniel et al. |
| 2007/0153353 A1 | 7/2007 | Gruner |
| 2007/0275546 A1 | 11/2007 | Maruyama et al. |
| 2007/0282076 A1 | 12/2007 | Bold et al. |
| 2008/0015269 A1 | 1/2008 | Bazan et al. |
| 2008/0017852 A1 | 1/2008 | Huh et al. |
| 2008/0018221 A1 | 1/2008 | Egen et al. |
| 2008/0020208 A1 | 1/2008 | Lee et al. |
| 2008/0029405 A1 | 2/2008 | Kosowsky et al. |
| 2008/0096016 A1 | 4/2008 | Tsurumi |
| 2008/0125571 A1 | 5/2008 | Oohata et al. |
| 2008/0139710 A1 | 6/2008 | Tsukada et al. |
| 2008/0140052 A1 | 6/2008 | Moller et al. |
| 2008/0216894 A1 | 9/2008 | Hammond |
| 2008/0264475 A1 | 10/2008 | Ito et al. |

(56) References Cited

U.S. PATENT DOCUMENTS

| | | |
|---|---|---|
| 2008/0290324 A1 | 11/2008 | Louwet et al. |
| 2008/0310007 A1 | 12/2008 | Agrawal et al. |
| 2009/0021894 A1 | 1/2009 | Ning et al. |
| 2009/0090907 A1 | 4/2009 | Kugler et al. |
| 2009/0111962 A1 | 4/2009 | Goodsen |
| 2009/0305132 A1 | 12/2009 | Gauthier et al. |
| 2010/0000883 A1 | 1/2010 | Morrin et al. |
| 2010/0025703 A1 | 2/2010 | Towns et al. |
| 2010/0076201 A1 | 3/2010 | Suzuki et al. |
| 2010/0108524 A1 | 5/2010 | Van Mol et al. |
| 2010/0163808 A1 | 7/2010 | Chen et al. |
| 2010/0172011 A1 | 7/2010 | Piroux et al. |
| 2010/0208413 A1 | 8/2010 | Kinlen et al. |
| 2010/0247870 A1 | 9/2010 | Suzuki et al. |
| 2010/0251955 A1 | 10/2010 | Knoll |
| 2010/0266897 A1 | 10/2010 | Lee et al. |
| 2010/0270055 A1 | 10/2010 | Zheng et al. |
| 2010/0288531 A1 | 11/2010 | Koyama et al. |
| 2010/0308281 A1 | 12/2010 | Zheng |
| 2011/0000527 A1 | 1/2011 | Saito et al. |
| 2011/0019339 A1 | 1/2011 | Merker et al. |
| 2011/0039164 A1 | 2/2011 | Akers et al. |
| 2011/0128675 A1 | 6/2011 | Merker et al. |
| 2011/0146796 A1 | 6/2011 | Sekiguchi et al. |
| 2011/0151324 A1 | 6/2011 | Chiang et al. |
| 2011/0168951 A1 | 7/2011 | Sotzing |
| 2011/0175065 A1 | 7/2011 | de la Vega et al. |
| 2011/0177398 A1 | 7/2011 | Affinito et al. |
| 2011/0204020 A1 | 8/2011 | Ray et al. |
| 2011/0220170 A1 | 9/2011 | Obonai et al. |
| 2011/0256450 A1 | 10/2011 | Campbell et al. |
| 2011/0261430 A1 | 10/2011 | Mazurkiewicz et al. |
| 2011/0284802 A1 | 11/2011 | Meguro et al. |
| 2011/0284825 A1 | 11/2011 | Yang et al. |
| 2011/0294257 A1 | 12/2011 | Shukla et al. |
| 2011/0309308 A1 | 12/2011 | Meguro et al. |
| 2012/0006379 A1 | 1/2012 | Sasaki |
| 2012/0019161 A1 | 1/2012 | Edman et al. |
| 2012/0043530 A1* | 2/2012 | Badre ................ H01B 1/122 257/40 |
| 2012/0049167 A1 | 3/2012 | Kuramochi et al. |
| 2012/0049171 A1 | 3/2012 | Fukuda et al. |
| 2012/0052395 A1 | 3/2012 | Badre et al. |
| 2012/0063063 A1 | 3/2012 | Qiu et al. |
| 2012/0069491 A1 | 3/2012 | Biler |
| 2012/0074360 A1 | 3/2012 | Funyuu et al. |
| 2012/0126931 A1 | 5/2012 | Batting et al. |
| 2012/0134073 A1 | 5/2012 | Uher et al. |
| 2012/0142832 A1 | 6/2012 | Varma et al. |
| 2012/0147528 A1 | 6/2012 | Biler et al. |
| 2012/0147529 A1 | 6/2012 | Biler et al. |
| 2012/0148835 A1 | 6/2012 | Radkowski et al. |
| 2012/0169213 A1 | 7/2012 | De Cola et al. |
| 2012/0224247 A1 | 9/2012 | Sotzing et al. |
| 2012/0245658 A1 | 9/2012 | Pan et al. |
| 2012/0256117 A1 | 10/2012 | Sugawara et al. |
| 2012/0256175 A1 | 10/2012 | Rinzler et al. |
| 2013/0001477 A1 | 1/2013 | Kimura et al. |
| 2013/0006118 A1 | 1/2013 | Pan et al. |
| 2013/0022755 A1 | 1/2013 | D'Arcy |

FOREIGN PATENT DOCUMENTS

| | | |
|---|---|---|
| WO | 2008055311 | 5/2008 |
| WO | 2008127112 | 10/2008 |
| WO | 2009054814 | 4/2009 |
| WO | 2010005066 | 1/2010 |
| WO | 2011088916 | 7/2011 |
| WO | 2011120103 | 10/2011 |
| WO | 2012013270 | 2/2012 |
| WO | 2012058681 | 5/2012 |
| WO | 2012084536 | 6/2012 |
| WO | 2012099466 | 7/2012 |
| WO | 2012110178 | 8/2012 |
| WO | 2012126566 | 9/2012 |
| WO | 2012130571 | 10/2012 |
| WO | 2012149992 | 11/2012 |
| WO | 2012172025 | 12/2012 |

OTHER PUBLICATIONS

Pringle et al "Electrodeposited PEDOT-on-plastic cathodes . . . ", Chem. Commun., 2010, 46, 5367-5369.*

* cited by examiner

POLYMER COMPOSITIONS, POLYMER FILMS, POLYMER GELS, POLYMER FOAMS, AND ELECTRONIC DEVICES CONTAINING SUCH FILMS, GELS AND FOAMS

This application is a division of U.S. application Ser. No. 13/199,134, filed Aug. 19, 2011 (now U.S. Pat. No. 8,784, 690), which claims the benefit of U.S. Provisional Application No. 61/571,568, filed Jun. 30, 2011; 61/402,135, filed Aug. 24, 2010; and 61/401,856, filed Aug. 20, 2010. The entire contents of these applications are explicitly incorporated herein by this reference.

FIELD OF THE INVENTION

The present invention relates to polymer compositions, films, gels, and foams, more particularly polymer compositions, films, gels, and foams comprising electrically conductive polymers, and electronic devices containing such polymer films, gels, and foams.

BACKGROUND

Transparent conductors, such as Indium Tin Oxide (ITO), combine the electrical conductivity of metal with the optical transparency of glass and are useful as components in electronic devices, such as in display devices. Flexibility is likely to become a broader challenge for ITO, which does not seem well suited to the next generation of display, lighting, or photovoltaic devices. These concerns have motivated a search for replacements using conventional materials and nanomaterials. There is variety of technical approaches for developing ITO substitutes and there are four areas in which these various alternatives compete: price, electrical conductivity, optical transparency, and physical resiliency.

Electrically conductive polymers, such as polythiophene polymers, particularly a polymer blend of poly(3,4-ethylenedioxythiophene) and poly(styrene sulfonate) ("PEDOT-PSS") have been investigated as possible alternatives to ITO. The electrical conductivity of electrically conductive polymers is typically lower than that of ITO, but can be enhanced through the use of conductive fillers, such as carbon nanotubes, and dopants. However, the performance of such films still falls short of that of ITO and trade-offs exist between optimizing the electrical conductivity and optimizing the optical transparency of electrically conductive polymers films.

There has been some interest in modifying the properties of electrically conductive polymer films using ionic liquids. U.S. Pat. No. 842,197, issued Nov. 30, 2010, broadly discloses mixtures of electrically conductive polymers and ionic liquids, including specifically, mixtures of PEDOT-PSS and 1-butyl-3-methyl-imidazolium tetrafluoroborate. U.S. Pat. No. 7,842,197, issued Nov. 30, 2010, discloses a method for producing a conductive material by contacting an electrically conductive polymer with certain ionic liquids U.S. Patent Application Publication 2008/0139710 A1, published Jun. 12, 2008, discloses conductive gels comprising certain conductive polymers dispersed or dissolved in certain ionic liquids, in combination with certain gelling agents.

There is an ongoing unresolved interest in increasing the electrical conductivity and optical transparency of electrically conductive polymer films, more specifically of PEDOT-PSS films.

SUMMARY OF THE INVENTION

In a first aspect, the present invention is directed to a polymer film, comprising a mixture of:
(a) an electrically conductive polymer, and
(b) an ionic liquid.

In one embodiment, the polymer film comprises:
(a) one or more electrically conductive polymers selected from polythiophene polymers, polyselenophene polymers, polytelurophene polymers, polypyrrole polymers, polyaniline polymers, fused heterocyclic heteroaromatic polymers and mixtures thereof, and, optionally, further comprising one or more water soluble polymeric acid dopants, and
(b) an ionic liquid, comprising one or more compounds each comprising:
  (i) an organic cation, and
  (ii) an anion selected from cyanate anions, tetracyanoborate anions, tetrakis-(p-(dimethyl(1H,1H,2H,2H-perfluorooctyl)silyl)phenyl)borate anions, and hexafluorophosphate anions,
provided that, if the ionic liquid comprises a compound that comprises a hexafluorophosphate anion, then the one or more electrically conductive polymers must comprise a mixture of one or more polythiophene polymers and one or more water soluble polymeric acid dopants.

In a second aspect, the present invention is directed to a method for making a polymer film according to the present invention, comprising:
(A) forming a layer of a polymer composition, said polymer composition comprising
  (a) a liquid carrier,
  (b) one or more electrically conductive polymers dissolved or dispersed in the liquid carrier, and
  (c) one or more ionic liquids dissolved or dispersed in the liquid carrier, and
(B) removing the liquid carrier from the layer.

In a third aspect, the present invention is directed to a polymer composition useful in making a polymer film according to the present invention, and comprising:
(a) a liquid carrier,
(b) an electrically conductive polymer dissolved or dispersed in the liquid carrier, and
(c) an ionic liquid dissolved or dispersed in the liquid carrier.

In a fourth aspect, the present invention is directed to a method for making a polymer composition comprising providing a solution or dispersion of an electrically conductive polymer in a liquid carrier and dissolving or dispersing an ionic liquid in the solution or dispersion of the electrically conductive polymer in the liquid carrier.

In a fifth aspect, the present invention is directed to an electronic device, comprising a plurality of layers, wherein at least one layer of the plurality of layers comprises polymer film according to the present invention.

The respective polymer film of the present invention and polymer film component of the electronic device of the present invention each typically provide high electrical conductivity, as well as, in some embodiments, high optical transmittance. In one embodiment, the polymer film of the present invention exhibits a sheet resistance of less than or equal to about 500 Ohms per square. In one embodiment, polymer film of the present invention exhibits a conductivity of greater than 500 Siemens per centimeter.

In a sixth aspect, the present invention is directed to an electrically conductive polymer gel, comprising the gelled combination of an electrically conductive polymer, an ionic liquid, and an aqueous liquid medium.

In one embodiment, the polymer gel comprises:
(a) a polymer network, comprising:
  (i) an electrically conductive polymer, comprising:
    (1) one or more electrically conductive polythiophene polymers, and
    (2) one or more water soluble polymeric acid dopants, and
  (ii) an amount of one or more ionic liquids effective to gel the electrically conductive polymer, and
(b) a liquid medium supported within the polymer network.

In a seventh aspect, the present invention is directed to a method for making an electrically conductive polymer gel, comprising contacting, in an aqueous liquid medium, one or more electrically conductive polymers and an amount of one or more ionic liquids effective to gel the one or more electrically conductive polymers.

In an eighth aspect, the present invention is directed to an electronic device, comprising a plurality of layers, wherein at least one layer of the plurality of layers comprises a polymer gel according to the present invention.

In a ninth aspect, the present invention is directed to a polymer foam, comprising a porous polymer network of the combination of an electrically conductive polymer and an ionic liquid.

In one embodiment, the polymer foam comprises a porous network, said porous network comprising the product obtained by:
(a) contacting, in a liquid medium:
  (i) an electrically conductive polymer, comprising:
    (1) one or more electrically conductive polythiophene polymers, and
    (2) one or more water soluble polymeric acid dopants, and
  (ii) an amount of one or more ionic liquids effective to gel the electrically conductive polymer, and
(b) removing the liquid medium from the gel.

In a tenth aspect, the present invention is directed to a method for making an electrically conductive polymer foam, comprising
  (A) contacting in a liquid medium, typically an aqueous liquid medium, one or more electrically conductive polymers and an amount of one or more ionic liquids effective to gel the one or more electrically conductive polymers to form a polymer gel, and
  (B) removing the liquid medium from the polymer gel.

In an eleventh aspect, the present invention is directed to, the present invention is directed to an electronic device, comprising a plurality of layers, wherein at least one layer of the plurality of layers comprises a polymer foam according to present invention.

In one embodiment, the polymer foam exhibits a sheet resistance of less than or equal to about 50 Ohms per square.

DETAILED DESCRIPTION OF THE INVENTION

Figure 1:
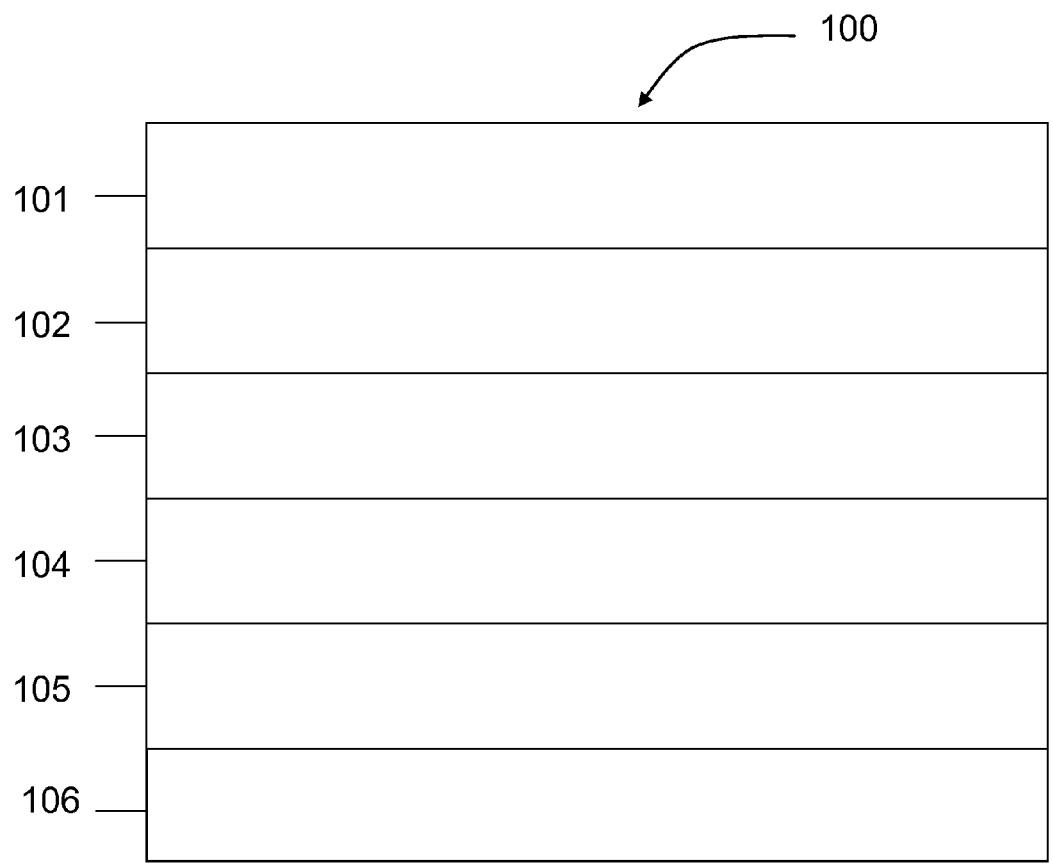
FIG. 1 is a schematic diagram of an electronic device according to the present invention.

As used herein, the following terms have the meanings ascribed below:

"acidic group" means a group capable of ionizing to donate a hydrogen ion,

"anode" means an electrode that is more efficient for injecting holes compared to than a given cathode, "buffer layer" generically refers to electrically conductive or semiconductive materials or structures that have one or more functions in an electronic device, including but not limited to, planarization of an adjacent structure in the device, such as an underlying layer, charge transport and/or charge injection properties, scavenging of impurities such as oxygen or metal ions, and other aspects to facilitate or to improve the performance of the electronic device, "cathode" means an electrode that is particularly efficient for injecting electrons or negative charge carriers, "confinement layer" means a layer that discourages or prevents quenching reactions at layer interfaces, "doped" as used herein in reference to an electrically conductive polymer means that the electrically conductive polymer has been combined with a polymer counterion for the electrically conductive polymer, which polymer counterion is referred to herein as "dopant", and is typically a polymer acid, which is referred to herein as a "polymer acid dopant", "doped electrically conductive polymer" means a polymer blend comprising an electrically conductive polymer and a polymer counterion for the electrically conductive polymer, "electrically conductive polymer" means any polymer or polymer blend that is inherently or intrinsically, without the addition of electrically conductive fillers such as carbon black or conductive metal particles, capable of electrical conductivity, more typically to any polymer or oligomer that exhibits a bulk specific conductance of greater than or equal to $10^{-7}$ Siemens per centimeter ("S/cm"), unless otherwise indicated, a reference herein to an "electrically conductive polymer" include any optional polymer acid dopant, "electrically conductive" includes conductive and semiconductive, "electroactive" when used herein in reference to a material or structure, means that the material or structure exhibits electronic or electro-radiative properties, such as emitting radiation or exhibiting a change in concentration of electron-hole pairs when receiving radiation, "electronic device" means a device that comprises one or more layers comprising one or more semiconductor materials and makes use of the controlled motion of electrons through the one or more layers, "electron injection/transport", as used herein in reference to a material or structure, means that such material or structure that promotes or facilitates migration of negative charges through such material or structure into another material or structure, "high-boiling solvent" refers to an organic compound which is a liquid at room temperature and has a boiling point of greater than 100° C., "hole transport" when used herein when referring to a material or structure, means such material or structure facilitates migration of positive charges through the thickness of such material or structure with relative efficiency and small loss of charge, "layer" as used herein in reference to an electronic device, means a coating covering a desired area of the device, wherein the area is not limited by size, that is, the area covered by the layer can, for example, be as large as an entire device, be as large as a specific functional area of the device, such as the actual visual display, or be as small as a single sub-pixel, "polymer" includes homopolymers and copolymers, "polymer blend" means a blend of two or more polymers, and "polymer network" means a three dimensional structure of interconnected segments of one or more polymer molecules, in which the segments are of a single polymer molecule and are interconnected by covalent bonds (a "crosslinked polymer network"), in which the segments are of two or more polymer molecules and are interconnected by means other than covalent bonds, (such as physical entanglements, hydrogen bonds, or ionic bonds) or by both covalent bonds and by means other than covalent bonds (a "physical polymer network").

As used herein, the terminology "$(C_x\text{-}C_y)$" in reference to an organic group, wherein x and y are each integers, means that the group may contain from x carbon atoms to y carbon atoms per group.

As used herein, the term "alkyl" means a monovalent straight, branched or cyclic saturated hydrocarbon radical, more typically, a monovalent straight or branched saturated $(C_1\text{-}C_{40})$hydrocarbon radical, such as, for example, methyl, ethyl, n-propyl, isopropyl, n-butyl, isobutyl, tert-butyl, hexyl, octyl, hexadecyl, octadecyl, eicosyl, behenyl, tricontyl, and tertacontyl. As used herein, the term "cycloalkyl" means a saturated hydrocarbon radical, more typically a saturated $(C_5\text{-}C_{22})$ hydrocarbon radical, that includes one or more cyclic alkyl rings, which may optionally be substituted on one or more carbon atoms of the ring with one or two $(C_1\text{-}C_6)$alkyl groups per carbon atom, such as, for example, cyclopentyl, cycloheptyl, cyclooctyl. The term "heteroalkyl" means an alkyl group wherein one or more of the carbon atoms within the alkyl group has been replaced by a hetero atom, such as nitrogen, oxygen, sulfur. The term "alkylene" refers to a divalent alkyl group including, for example, methylene, and poly(methylene).

As used herein, the term "hydroxyalkyl" means an alkyl radical, more typically a $(C_1\text{-}C_{22})$alkyl radical, that is substituted with one or more hydroxyl groups, including, for example, hydroxymethyl, hydroxyethyl, hydroxypropyl, and hydroxydecyl.

As used herein, the term "alkoxyalkyl" means an alkyl radical that is substituted with one or more alkoxy substituents, more typically a $(C_1\text{-}C_{22})$alkyloxy-$(C_1\text{-}C_6)$alkyl radical, including, for example, methoxymethyl, and ethoxybutyl.

As used herein, the term "alkenyl" means an unsaturated straight or branched hydrocarbon radical, more typically an unsaturated straight, branched, $(C_2\text{-}C_{22})$ hydrocarbon radical, that contains one or more carbon-carbon double bonds, including, for example, ethenyl, n-propenyl, and iso-propenyl, As used herein, the term "cycloalkenyl" means an unsaturated hydrocarbon radical, typically an unsaturated $(C_5\text{-}C_{22})$ hydrocarbon radical, that contains one or more cyclic alkenyl rings and which may optionally be substituted on one or more carbon atoms of the ring with one or two $(C_1\text{-}C_6)$ alkyl groups per carbon atom, including, for example, cyclohexenyl and cycloheptenyl.

As used herein, the term "aryl" means a monovalent unsaturated hydrocarbon radical containing one or more six-membered carbon rings in which the unsaturation may be represented by three conjugated double bonds, which may be substituted one or more of carbons of the ring with hydroxy, alkyl, alkoxyl, alkenyl, halo, haloalkyl, monocyclic aryl, or amino, including, for example, phenyl, methylphenyl, methoxyphenyl, dimethylphenyl, trimethylphenyl, chlorophenyl, trichloromethylphenyl, triisobutyl phenyl, tristyrylphenyl, and aminophenyl.

As used herein, the term "aralkyl" means an alkyl group substituted with one or more aryl groups, more typically a $(C_1\text{-}C_{18})$alkyl substituted with one or more $(C_6\text{-}C_{14})$aryl substituents, including, for example, phenylmethyl, phenylethyl, and triphenylmethyl.

As used herein, the term "polycyclic heteroaromatic" refers to compounds having more than one aromatic ring, at least one of which includes at least one hetero atom in the ring, wherein adjacent rings may be linked to each other by one or more bonds or divalent bridging groups or may be fused together.

As used herein, the following terms refer to the corresponding substituent groups:

"amido" is —$R^1$—C(O)N($R^6$)$R^6$,
"amidosulfonate" is —$R^1$—C(O)N($R^4$)$R^2$—SO$_3$Z,
"benzyl" is —CH$_2$—C$_6$H$_5$,
"carboxylate" is —$R^1$—C(O)O—Z or —$R^1$—O—C(O)—Z,
"ether" is —$R^1$—(O—$R^3$)$_p$—O—$R^3$, "ether carboxylate" is —$R^1$—O—$R^2$—C(O)O—Z or —$R^1$—O—$R^2$—O—C(O)—Z,
"ether sulfonate" is —$R^1$—O—$R^2$—SO$_3$Z,
"ester sulfonate" is —$R^1$—O—C(O)$R^2$—SO$_3$Z,
"sulfonimide" is —$R^1$—SO$_2$—NH—SO$_2$—$R^3$, and
"urethane" is —$R^1$—O—C(O)—N($R^4$)$_2$, wherein:
  each $R^1$ is absent or alkylene,
  each $R^2$ is alkylene,
  each $R^3$ is alkyl,
  each $R^4$ is H or an alkyl,
  p is 0 or an integer from 1 to 20, and
  each Z is H, alkali metal, alkaline earth metal, N($R^3$)$_4$ or $R^3$, wherein any of the above groups may be non-substituted or substituted, and any group may have fluorine substituted for one or more hydrogens, including perfluorinated groups.

In one embodiment, respective polymer film of the present invention and polymer film component of the electronic device of the present invention each comprise, based on 100 parts by weight ("pbw") of the polymer film:

(i) from about 1 to about 99.9 pbw, more typically from about 2 to about 99.9 pbw, and even more typically from about 10 to about 80 pbw of the electrically conductive polymer, and (ii) from about 0.1 to about 99 pbw, more typically from about 0.1 to about 97.5 pbw, and even more typically from about 20 to about 90 pbw of the ionic liquid.

In one embodiment, the electrically conductive polymer of the respective polymer film of the present invention and/or polymer film component of the electronic device of the present invention forms a continuous phase and the ionic liquid forms a discontinuous phase that is dispersed in the continuous electrically conductive polymer phase.

In one embodiment, the electrically conductive polymer of the respective polymer film of the present invention and/or polymer film component of the electronic device of the present invention forms a polymer network and polymer network is impregnated with the ionic liquid.

In one embodiment, the electrically conductive polymer of the respective polymer film of the present invention and/or polymer film component of the electronic device of the present invention, forms a physical polymer network of non-crosslinked molecules of the electrically conductive polymer.

In one embodiment, the electrically conductive polymer of the respective polymer film of the present invention and/or polymer film component of the electronic device of the present invention forms a crosslinked polymer network.

In one embodiment, the respective polymer film of the present invention and polymer film component of the electronic device of the present invention each comprise, based on 100 pbw of the polymer film:
(i) from greater than 25 pbw to about 99.9 pbw, more typically from greater than 25 pbw to about 99.9 pbw, and even more typically from greater than 25 pbw to about 80 pbw of the electrically conductive polymer, and
(ii) from about 0.1 to less than 75 pbw, more typically from about 0.1 to less than 75 pbw, and even more typically from about 20 to less than 75 pbw of the ionic liquid.

In one embodiment of the respective polymer film of the present invention and polymer film component of the electronic device of the present invention, the ratio of the total amount by weight of the ionic liquid in such film to the total amount by weight of the electrically conductive polymer in such film is typically from greater than 0:1 to about 1.5:1, more typically from about 0.1:1 to 1:1.

In one embodiment, the respective polymer film of the present invention and polymer film component of the electronic device of the present invention each comprise, based on 100 pbw of the polymer film:
(i) from greater than 25 pbw to about 99.9 pbw, more typically from greater than 25 pbw to about 99.9 pbw, and even more typically from greater than 25 pbw to about 80 pbw of the electrically conductive polymer, and
(ii) from about 0.1 to less than 75 pbw, more typically from about 0.1 to less than 75 pbw, and even more typically from about 20 to less than 75 pbw of the ionic liquid, and
the ratio of the total amount by weight of the ionic liquid in such film to the total amount by weight of the electrically conductive polymer in such film is typically from greater than 0:1 to about 1.5:1, more typically from about 0.1:1 to 1:1.

In one embodiment, respective polymer film of the present invention and polymer film component of the electronic device of the present invention each comprise a discontinuous ionic liquid phase dispersed within a continuous phase of the electrically conductive polymer, and typically exhibit good chemical stability, low flammability, negligible vapor pressure, and high ionic conductivity.

In one embodiment, the polymer gel of the present invention comprises, based on 100 pbw of the gel,
(a) from about 2 pbw to about 90 pbw of a polymer network, said network comprising, based on 100 pbw of said network:
    (i) from about 10 to about 40 pbw, more typically from about 15 to about 35 pbw, and even more typically from about 20 to about 35 pbw of the electrically conductive polymer, and
    (ii) from about 60 to about 90 pbw, more typically from about 65 to about 85 pbw, and even more typically from about 65 to about 80 pbw of the ionic liquid, and
(b) from about 10 pbw to about 98 pbw of an aqueous liquid medium.

In one embodiment of the polymer gel of the present invention, the ratio of the total amount by weight of the ionic liquid in such gel to the total amount by weight of the electrically conductive polymer in such gel is typically from about 1.5:1 to about 45:1, more typically from 1.7:1 to 20:1, even more typically from about 1.7:1 to about 10:1, and still more typically from 2:1 to 8:1.

In one embodiment, the polymer gel of the present invention comprises, based on 100 pbw of the gel,
(a) from about 2 pbw to about 90 pbw of a polymer network, said network comprising, based on 100 pbw of said network:
    (i) from about 10 to about 40 pbw, more typically from about 15 to about 35 pbw, and even more typically from about 20 to about 35 pbw of the electrically conductive polymer, and
    (ii) from about 60 to about 90 pbw, more typically from about 65 to about 85 pbw, and even more typically from about 65 to about 80 pbw of the ionic liquid, and
(b) from about 10 pbw to about 98 pbw of an aqueous liquid medium, and the ratio of the total amount by weight of the ionic liquid in such gel to the total amount by weight of the electrically conductive polymer in such gel is typically from about 1.5:1 to about 45:1, more typically from 1.7:1 to 20:1, even more typically from about 1.7:1 to about 10:1, and still more typically from 2:1 to 8:1.

In one embodiment, the polymer network of the polymer gel of the present invention comprises a reaction product of the electrically conductive polymer and the ionic liquid. In one embodiment, the polymer network is impregnated with the aqueous liquid medium. In one embodiment, the storage modulus, G', of the polymer gel exceeds the loss modulus, G", of the polymer gel at any angular frequency within a range of from about 0.01 to about 100 radians/second, as determined by dynamic oscillatory measurements using a dynamic mechanical analysis instrument, such as, for example, a TA Instruments Q400 DMA.

In one embodiment, the polymer foam of the present invention and polymer foam component of the electronic device of the present invention each comprise the product obtained by contacting, typically in a liquid medium, based on 100 pbw of the polymer foam:
(i) from about 10 to about 40 pbw, more typically from about 15 to about 35 pbw, and even more typically from about 20 to about 35 pbw of the electrically conductive polymer, and
(ii) from about 60 to about 90 pbw, more typically from about 65 to about 85 pbw, and even more typically from about 65 to about 80 pbw of the ionic liquid, In one embodiment of the polymer foam of the present invention and polymer foam component of the electronic device of the present invention, the ratio of the total amount by weight of the ionic liquid in such foam to the total amount by weight of the electrically conductive polymer in such foam is typically from about 1.5:1 to about 45:1, more typically from 1.7:1 to 20:1, even more typically from about 1.7:1 to about 10:1, and still more typically from 2:1 to 8:1.

In one embodiment, the polymer foam of the present invention and polymer foam component of the electronic device of the present invention each comprise the product obtained by contacting, based on 100 pbw of the polymer foam:
(i) from about 10 to about 40 pbw, more typically from about 15 to about 35 pbw, and even more typically from about 20 to about 35 pbw of the electrically conductive polymer, and (ii) from about 60 to about 90 pbw, more typically from about 65 to about 85 pbw, and even more typically from about 65 to about 80 pbw of the ionic liquid, and the ratio of the total amount by weight of the ionic liquid in such foam to the total amount by weight of the electrically conductive polymer in such foam is typically from about 1.5:1 to about 45:1, more typically from 1.7:1 to 20:1, even more typically from about 1.7:1 to about 10:1, and still more typically from 2:1 to 8:1.

In one embodiment, the polymer foam of the present invention comprises a reaction product of the electrically conductive polymer and the ionic liquid. In one embodiment, the polymer foam has a porous structure, a high strength to weight and surface area to volume ratios, and high electrical conductivity. In one embodiment, the storage modulus, G', of the polymer foam exceeds the loss modulus, G", of the polymer foam at any angular frequency within a range of from about 0.01 to about 100 radians/second, as determined by dynamic oscillatory measurements using a dynamic mechanical analysis instrument, such as, for example, a TA Instruments Q400 DMA.

In one embodiment, the polymer composition of the present invention comprises, based on 100 pbw of the polymer composition:
(a) from greater than 0 to less than 100 pbw, more typically from about 50 to less than 100 pbw, even more typically from about 90 to about 99.5 pbw of liquid carrier,
(b) from greater than 0 to less than 100 pbw, more typically from greater than 0 to about 50 pbw, even more typically from 0.5 to about 10 pbw, of the mixture of electrically conductive polymer and ionic liquid, comprising, based on 100 pbw of the total amount of the electrically conductive polymer and the ionic liquid;
  (i) from about 1 to about 99.9 pbw, more typically from about 2 to about 99.9 pbw, and even more typically from about 25 to about 80 pbw of the electrically conductive polymer, and
  (ii) from about 0.1 to about 99 pbw, more typically from about 0.1 to about 97.5 pbw, and even more typically from about 20 to about 75 pbw of the ionic liquid.

As mentioned above, U.S. Patent Application Publication 2008/0139710 A1, published Jun. 12, 2008, discloses conductive gels comprising certain conductive polymers dispersed or dissolved in certain ionic liquids, in combination with certain gelling agents. Suitable gelling agents are said to include compounds having at least two polar groups, such as pentaerythritol, or compounds that have at least two reactive functional groups, such as isocyanate compounds having at least two isocyanate groups, wherein an intermolecular bond, such as a hydrogen bond, is formed between the polar groups of the gelling agent or a covalent bond is formed between the reactive functional of the gelling agent to thereby form a three dimensional network that facilitates gelatin of such composition. While not wishing to be bound by theory, it is believed that polymer gel and polymer foam of the present invention each comprise the combination of a porous polymer network and aqueous liquid within the interstices of the network, that the polymer foam of the present invention comprises the porous polymer network that remains after removal of some or all of the liquid medium component of the polymer gel of the present invention, and that in each case, the porous polymer network is a product of an association or a reaction between the electrically conductive polymer and the ionic liquid to form a new compound or complex, in the absence of a separate gelling agent. In any case, the only components required to form the polymer gel and foam compositions of the present invention are the liquid carrier, the conductive polymer and the ionic liquid and the polymer gel and polymer foam of the present invention can thus be and typically are formed in the absence of a gelling agent. In one embodiment, the polymer gel of the present invention does not comprise a gelling agent. In one embodiment, the polymer foam of the present invention does not comprise a gelling agent.

In one embodiment, the polymer composition of the present invention is a polymer dispersion, wherein the liquid carrier component of the dispersion may be any liquid in which the electrically conductive polymer component of the composition is insoluble, but within which the electrically conductive polymer component of the composition is dispersible. In one embodiment, the liquid carrier of the polymer composition of the present invention is an aqueous medium that comprises water. In one embodiment, the liquid carrier is an aqueous medium that consists essentially of water. In one embodiment, the liquid carrier is an aqueous medium that consists of water. In one embodiment, the liquid carrier of the polymer composition of the present invention is a non-aqueous medium that comprises one or more water miscible organic liquids. In one embodiment, the liquid carrier of the polymer composition of the present invention is an aqueous medium that comprises water and, optionally, one or more water miscible organic liquids, and the electrically conductive polymer is dispersible in the aqueous medium. Suitable water miscible organic liquids include polar aprotic organic solvents, such as, for example methanol, ethanol, and propanol. In one embodiment, the liquid carrier comprises, based on 100 pbw of the liquid medium, from about 10 to 100 pbw, more typically from about 50 pbw to 100 pbw, and even more typically, from about 90 to 100 pbw, water and from 0 pbw to about 90 pbw, more typically from 0 pbw to about 50 pbw, and even more typically from 0 pbw to about 10 pbw of one or more water miscible organic liquids.

In one embodiment, the polymer composition is a polymer solution, wherein the liquid carrier component of the composition may be any liquid in which the electrically conductive polymer component of the composition is soluble. In one embodiment, the liquid carrier is an non-aqueous liquid medium and the electrically conductive polymer is soluble in and is dissolved in the non-aqueous liquid medium. Suitable non-aqueous liquid media include organic liquids that have a boiling point of less than 120° C., more typically, less than or equal to about 100° C., selected, based on the choice of electrically conductive polymer, from non-polar organic solvents, such as hexanes, cyclohexane, benzene, toluene, chloroform, and diethyl ether, polar aprotic organic solvents, such as dichloromethane, ethyl acetate, acetone, and tetrahydrofuran, polar protic organic solvents, such as methanol, ethanol, and propanol, as well as mixtures of such solvents.

In one embodiment, the liquid carrier may optionally further comprise, based on 100 pbw of the polymer composition of the present invention, from greater than 0 pbw to about 15 pbw, more typically from about 1 pbw to about 10 pbw, of an organic liquid selected from high boiling polar organic liquids, typically having a boiling point of at least 120° C., more typically from diethylene glycol, mesoerythritol, 1,2,3,4-tetrahydroxybutane, 2-nitroethanol, glycerol, sorbitol, dimethyl sulfoxide, tetrahydrofurane, dimethyl formamide, and mixtures thereof.

The electrically conductive polymer component of the respective polymer composition, polymer film, and/or electronic device of the present invention may comprise one or more homopolymers, one or more co-polymers of two or more respective monomers, or a mixture of one or more homopolymers and one or more copolymers. The respective polymer composition, polymer film, and electrically conductive polymer film component of the electronic device of the present invention may each comprise a single polymer or may comprise a blend two or more polymers which differ from each other in some respect, for example, in respect to composition, structure, or molecular weight.

In one embodiment, the electrically conductive polymer of the respective polymer composition, polymer film, and/or electrically conductive polymer film component of the electronic device of the present invention comprises one or more polymers selected from polythiophene polymers, poly(selenophene) polymers, poly(telurophene) polymers, polypyrrole polymers, polyaniline polymers, fused polycylic heteroaromatic polymers, and blends of any such polymers.

In one embodiment, the electrically conductive polymer comprises one or more polymers selected from electrically conductive polythiophene polymers, electrically conductive poly(selenophene) polymers, electrically conductive poly(telurophene) polymers, and mixtures thereof. Suitable polythiophene polymers, poly(selenophene) polymers, poly(telurophene) polymers and methods for making such polymers are generally known. In one embodiment, the electrically conductive polymer comprises at least one polythiophene polymer, poly(selenophene) polymer, or poly(telurophene) polymer that comprises 2 or more, more typically 4 or more, monomeric units according to structure (I) per molecule of the polymer:

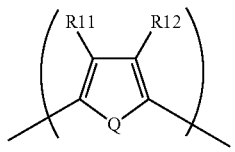
(I)

wherein:
Q is S, SE, or Te, more typically, S, and
each occurrence of $R^{11}$ and each occurrence of $R^{12}$ is independently H, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, hydroxy, hydroxyalkyl, benzyl, carboxylate, ether, ether carboxylate, amidosulfonate, ether sulfonate, ester sulfonate, and urethane, or both the $R^1$ group and $R^2$ group of a given monomeric unit are fused to form, together with the carbon atoms to which they are attached, an alkylene or alkenylene chain completing a 3, 4, 5, 6, or 7-membered aromatic or alicyclic ring, which ring may optionally include one or more divalent nitrogen, selenium, tellurium, sulfur, or oxygen atoms.

In one embodiment, Q is S, the $R^{11}$ and $R^{12}$ of the monomeric unit according to structure (I) are fused and the electrically conductive polymer comprises a polydioxythiopene polymer that comprises 2 or more, more typically 4 or more, monomeric units according to structure (I.a) per molecule of the polymer:

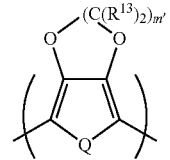
(I.a)

wherein:
Q is S, SE, or Te, more typically, S,
each occurrence of $R^{13}$ is independently H, alkyl, hydroxy, heteroalkyl, alkenyl, heteroalkenyl, hydroxalkyl, amidosulfonate, benzyl, carboxylate, ether, ether carboxylate, ether sulfonate, ester sulfonate, or urethane, and
m' is 2 or 3.

In one embodiment, all $R^{13}$ groups of the monomeric unit according to structure (I.a) are each H, alkyl, or alkenyl. In one embodiment, at least one $R^{13}$ groups of the monomeric unit according to structure (I.a) is not H. In one embodiment, each $R^{13}$ groups of the monomeric unit according to structure (I.a) is H.

In one embodiment, the electrically conductive polymer comprises a polythiophene homopolymer of monomeric units according to structure (I.a) wherein each $R^{13}$ is H and m' is 2, known as poly(3,4-ethylenedioxythiophene), more typically referred to as "PEDOT".

In one embodiment, the electrically conductive polymer comprises one or more polypyrrole polymers. Suitable polypyrrole polymers and methods for making such polymers are generally known. In one embodiment, the electrically conductive polymer comprises a polypyrrole polymer that comprises 2 or more, more typically 4 or more, monomeric units according to structure (II) per molecule of the polymer:

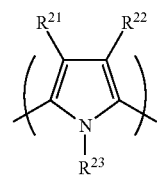
(II)

wherein:
each occurrence of $R^{21}$ and each occurrence of $R^{22}$ is independently H, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, hydroxy, hydroxyalkyl, benzyl, carboxylate, ether, amidosulfonate, ether carboxylate, ether sulfonate, ester sulfonate, and urethane, or the $R^{21}$ and $R^{22}$ of a given pyrrole unit are fused to form, together with the carbon atoms to which they are attached, an alkylene or alkenylene chain completing a 3, 4, 5, 6, or 7-membered aromatic or alicyclic ring, which ring may optionally include one or more divalent nitrogen, sulfur or oxygen atoms, and
each occurrence of $R^{23}$ is independently selected so as to be the same or different at each occurrence and is selected from hydrogen, alkyl, alkenyl, aryl, alkanoyl, alkylthioalkyl, alkylaryl, arylalkyl, amino, epoxy, silane, siloxane, hydroxy, hydroxyalkyl, benzyl, carboxylate, ether, ether carboxylate, ether sulfonate, ester sulfonate, and urethane.

In one embodiment, each occurrence of $R^{21}$ and each occurrence of $R^{22}$ is independently H, alkyl, alkenyl, alkoxy, cycloalkyl, cycloalkenyl, hydroxy, hydroxyalkyl, benzyl, carboxylate, ether, amidosulfonate, ether carboxylate, ether sulfonate, ester sulfonate, urethane, epoxy, silane, siloxane, or alkyl, wherein the alky group may optionally be substituted with one or more of sulfonic acid, carboxylic acid, acrylic acid, phosphoric acid, phosphonic acid, halogen, nitro, cyano, hydroxyl, epoxy, silane, or siloxane moieties.

In one embodiment, each occurrence of $R^{23}$ is independently H, alkyl, and alkyl substituted with one or more of sulfonic acid, carboxylic acid, acrylic acid, phosphoric acid, phosphonic acid, halogen, cyano, hydroxyl, epoxy, silane, or siloxane moieties.

In one embodiment, each occurrence of $R^{21}$, $R^{22}$, and $R^{23}$ is H.

In one embodiment, $R^{21}$ and $R^{22}$ are fused to form, together with the carbon atoms to which they are attached, a 6- or 7-membered alicyclic ring, which is further substituted with a group selected from alkyl, heteroalkyl, hydroxy, hydroxyalkyl, benzyl, carboxylate, ether, ether carboxylate, ether sulfonate, ester sulfonate, and urethane. In one embodiment, and $R^{22}$ are fused to form, together with the carbon atoms to which they are attached, a 6- or 7-membered alicyclic ring, which is further substituted with an alkyl group. In one embodiment, $R^{21}$ and $R^{22}$ are fused to form, together with the carbon atoms to which they are attached, a 6- or 7-membered alicyclic ring, which is further substituted with an alkyl group having at least 1 carbon atom.

In one embodiment, $R^{21}$ and $R^{22}$ are fused to form, together with the carbon atoms to which they are attached, a —O—(CHR$^{24}$)n'-O— group, wherein:

each occurrence of $R^{24}$ is independently H, alkyl, hydroxy, hydroxyalkyl, benzyl, carboxylate, amidosulfonate, ether, ether carboxylate, ether sulfonate, ester sulfonate, and urethane, and n' is 2 or 3.

In one embodiment, at least one $R^{24}$ group is not hydrogen. In one embodiment, at least one $R^{24}$ group is a substituent having F substituted for at least one hydrogen. In one embodiment, at least one Y group is perfluorinated.

In one embodiment, the electrically conductive polymer comprises one or more polyaniline polymers. Suitable polyaniline polymers and methods of making such polymers are generally known. In one embodiment, the electrically conductive polymer comprises a polyaniline polymer that comprises 2 or more, more typically 4 or more, monomeric units selected from monomeric units according to structure (III) and monomeric units according to structure (III.a) per molecule of the polymer:

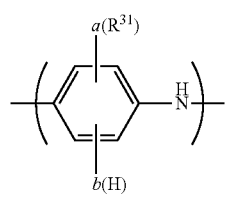

(III)

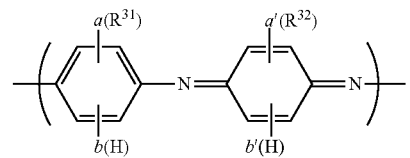

(III.a)

wherein:

each occurrence of $R^{31}$ and $R^{32}$ s independently alkyl, alkenyl, alkoxy, cycloalkyl, cycloalkenyl, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, carboxylic acid, halogen, cyano, or alkyl substituted with one or more of sulfonic acid, carboxylic acid, halo, nitro, cyano or epoxy moieties, or two $R^{31}$ or $R^{32}$ groups on the same ring may be fused to form, together with the carbon atoms to which they are attached, a 3, 4, 5, 6, or 7-membered aromatic or alicyclic ring, which ring may optionally include one or more divalent nitrogen, sulfur or oxygen atoms, and each a and a' is independently an integer from 0 to 4, each b and b' is integer of from 1 to 4, wherein, for each ring, the sum of the a and b coefficients of the ring or the a' and b' coefficients of the ring is 4.

In one embodiment, a or a'=0 and the polyaniline polymer is an non-substituted polyaniline polymers referred to herein as a "PANI" polymer.

In one embodiment, the electrically conductive polymer comprises one or more polycylic heteroaromatic polymers. Suitable polycylic heteroaromatic polymers and methods for making such polymers are generally known. In one embodiment, the electrically conductive polymer comprises one or more polycylic heteroaromatic polymers that comprise 2 or more, more typically 4 or more, monomeric units per molecule that are derived from one or more heteroaromatic monomers, each of which is independently according to Formula (IV):

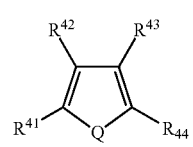

(IV)

wherein:

Q is S or NH, $R^{41}$, $R^{42}$, $R^{43}$, and $R^{44}$ each are each independently H, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, hydroxy, hydroxyalkyl, benzyl, carboxylate, ether, ether carboxylate, amidosulfonate, ether sulfonate, ester sulfonate, or urethane, provided that at least one pair of adjacent substituents $R^{41}$ and $R^{42}$, $R^{42}$ and $R^{43}$, or $R^{43}$ and $R^{44}$ are fused to form, together with the carbon atoms to which they are attached, a 5 or 6-membered aromatic ring, which ring may optionally include one or more hetero atoms, more typically selected from divalent nitrogen, sulfur and oxygen atoms, as ring members.

In one embodiment, the polycylic heteroaromatic polymers comprise 2 or more, more typically 4 or more, monomeric units per molecule that are derived from one or more heteroaromatic monomers, each of which is independently according to structure (V):

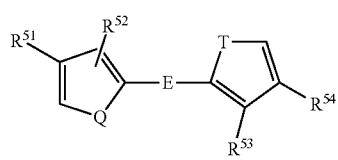

wherein:
Q is S, Se, Te, or NR$^{55}$,
T is S, Se, Te, NR$^{55}$, O, Si(R$^{55}$)$_2$, or PR$^{55}$,
E is alkenylene, arylene, and heteroarylene,
R$^{55}$ is hydrogen or alkyl,
R$^{51}$, R$^{52}$, R$^{53}$, and R$^{54}$ are each independently H, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, hydroxy, hydroxyalkyl, benzyl, carboxylate, ether, ether carboxylate, amidosulfonate, ether sulfonate, and urethane, or where each pair of adjacent substituents R$^{51}$ and R$^{52}$ and adjacent substituents R$^{53}$ and R$^{54}$ may independently form, together with the carbon atoms to which they are attached, a 3, 4, 5, 6, or 7-membered aromatic or alicyclic ring, which ring may optionally include one or more hetero atoms, more typically selected from divalent nitrogen, sulfur and oxygen atoms, as ring members.

In one embodiment, the electrically conductive polymer comprises one or more copolymers that each comprise at least one first monomeric unit per molecule that is according to formula (I), (I.a), (II), (III), or (III.a) or that is derived from a heteroaromatic monomer according to structure (IV) or (V), and further comprises one or more second monomeric units per molecule that differ in structure and/or composition from the first monomeric units. Any type of second monomeric units can be used, so long as it does not detrimentally affect the desired properties of the copolymer. In one embodiment, the copolymer comprises, based on the total number of monomer units of the copolymer, less than or equal to 50%, more typically less than or equal to 25%, even more typically less than or equal to 10% of second monomeric units.

Exemplary types of second monomeric units include, but are not limited to those derived from alkenyl, alkynyl, arylene, and heteroarylene monomers, such as, for example, fluorene, oxadiazole, thiadiazole, benzothiadiazole, phenylene vinylene, phenylene ethynylene, pyridine, diazines, and triazines, all of which may be further substituted, that are copolymerizable with the monomers from which the first monomeric units are derived.

In one embodiment, the copolymers are made by first forming an intermediate oligomer having the structure A-B-C, where A and C represent first monomeric units, which can be the same or different, and B represents a second monomeric unit. The A-B-C intermediate oligomer can be prepared using standard synthetic organic techniques, such as Yamamoto, Stille, Grignard metathesis, Suzuki and Negishi couplings. The copolymer is then formed by oxidative polymerization of the intermediate oligomer alone, or by copolymerization of the intermediate oligomer with one or more additional monomers.

In one embodiment, the electrically conductive polymer comprises at least one homopolymer of a monomer selected from thiophene monomers, pyrrole monomers, aniline monomers, and polycyclic aromatic monomers, more typically a poly(thiophene) homopolymer. In one embodiment, the electrically conductive polymer comprises at least one copolymer of two or more monomers, wherein at least one of such monomers is selected from thiophene monomers, pyrrole monomers, aniline monomers, and polycyclic aromatic monomers.

In one embodiment, the weight average molecular weight of the electrically conductive polymer is from about 1000 to about 2,000,000 grams per mole, more typically from about 5,000 to about 1,000,000 grams per mole, and even more typically from about 10,000 to about 500,000 grams per mole.

In one embodiment, the electrically conductive polymer further comprises a polyanion, such as a polymer acid dopant, typically (particularly where the liquid medium of the polymer composition is an aqueous medium), a water soluble polymer acid dopant. In one embodiment, the electrically conductive polymers used in the new compositions and methods are prepared by oxidatively polymerizing the corresponding monomers in aqueous solution containing a water soluble acid, typically a water-soluble polymer acid. In one embodiment, the acid is a polymer sulfonic acid. Some non-limiting examples of the acids are polysulfonic acid polymers, such as for example, poly(styrenesulfonic acid) ("PSSA"), polyvinylsulfonic acid, and poly(2-acrylamido-2-methyl-1-propanesulfonic acid) ("PAAMPSA"), and polycarboxylic acid polymers, such as for example, poly(acrylic acid), poly(methacrylic acid), and poly(maleic acid), as well as mixtures thereof. The acid anion provides the dopant for the conductive polymer. In one embodiment, the electrically conductive polymer comprises a cationic electrically conductive polymer and a polyanion. The oxidative polymerization is carried out using an oxidizing agent such as ammonium persulfate, sodium persulfate, and mixtures thereof. Thus, for example, when aniline is oxidatively polymerized in the presence of PMMPSA, the doped electrically conductive polymer blend PANI/PAAMPSA is formed. When ethylenedioxythiophene (EDT) is oxidatively polymerized in the presence of PSSA, the doped electrically conductive polymer blend PEDT/PSS is formed. The conjugated backbone of PEDT is partially oxidized and positively charged. Oxidatively polymerized pyrroles and thienothiophenes also have a positive charge which is balanced by the acid anion.

In one embodiment, the water soluble polymer acid selected from the polysulphonic acids, more typically, poly(styrene sulfonic acid), or poly(acrylamido-2-methyl-1-propane-sulfonic acid), or a polycarboxylic acid, such as polyacrylic acid, polymethacrylic acid, or polymaleic acid. The polymer acid typically has a weight average molecular weight of from about 1,000 to about 2,000,000 grams per mole (g/mole), more typically of from about 2,000 to about 1,000,000 g/mole.

In one embodiment, the electrically conductive polymer component of the respective polymer film, polymer gel, polymer foam, polymer composition, and/or electronic device of the present invention comprises, based on 100 pbw of the electrically conductive polymer:
(i) from greater than 0 pbw to 100 pbw, more typically from about 10 to about 50 pbw, and even more typically from about 20 to about 50 pbw, of one or more electrically conductive polymers, more typically of one or more electrically conductive polymer comprising monomeric units according to structure (I.a), more typically one or more polythiophene polymers comprising monomeric units according to structure (I.a) wherein Q is S, and even more typically of one or more electrically conductive polymers comprising poly(3,4-ethylenedioxythiophene), and (ii) from 0 pbw to 100 pbw, more typically from about 50 to about 90 pbw, and even more typically from about 50 to about 80 pbw, of one or more water soluble polymer acid dopants, more typically of one or more water soluble polymer acid dopants comprising a poly(styrene sulfonic acid) dopant.

Ionic liquids are organic salts that consist entirely of anionic and cationic species and have a melting point of less than or equal to 100° C. In one embodiment, the ionic liquid has a melting point of less than or equal to 75° C., more typically less than or equal to 50° C. and even more typically less than or equal to 25° C.

In one embodiment, the ionic liquid comprises one or more organic salts that consist entirely of anionic and cationic species and have a melting point of less than or equal to 100° C.

In one embodiment, the cation of a ionic liquid compound is a bulky, asymmetrical organic moiety. Typical cations for suitable ionic liquid compounds include, for example:

ammonium or tetraalkyl ammonium cations, such as, for example, tetramethyl ammonium, tetrabutyl ammonium, tetrahexyl ammonium, butyltrimethyl ammonium, and methyltrioctyl ammonium cations, guanidinium cations such as, for example, N,N,N',N'-tetrahexyl-N",N"-dimethylguanidinium cations, imidazolium cations, more typically, imidazolium cations that are substituted with from 1 to 3, more typically 2 to 3, alkyl, hydroxyalkyl, and/or aryl substituents per boron atom, such as, for example, 1,3-dimethyl-imidazolium, 1-benzyl-3-methyl-imidazolium, 1-butyl-3-methyl-imidazolium, 1-ethyl-3-methyl-imidazolium, 1-hexyl-3-methyl-imidazolium, 1-methyl-3-propyl-imidazolium, 1-methyl-3-octyl-imidazolium, 1-methyl-3-tetradecyl-imidazolium, 1-methyl-3-phenyl-imidazolium, 1,2,3-trimethyl-imidazolium, 1,2-methyl-3-octyl-imidazolium, 1-butyl-2,3-dimethyl-imidazolium, 1-hexyl-2,3-methyl-imidazolium, and 1-(2-hydroxyethyl)-2,3-dimethyl-imidazolium cations, morpholinium cations, such as, for example, N-methyl-morpholinium and N-ethyl-morpholinium cations, phosphonium cations, such as for example, tetrabutyl phosphonium and tributylmethyl phosphonium cations, piperidinium cations, such as, for example, 1-butyl-1-methyl-piperidinium and 1-methyl-1-propyl-piperidinium cations, pyradazinium cations, pyrazinium cations, such as, for example, 1-ethyl-4-methyl-pyrazinium, 1-octyl-4-propyl-pyrazinium cations, pyrazolium cations, such as, for example, 1-ethyl-2,3,5-pyrazolinium cations, pyridinium cations, such as for example, N-butyl-pyridinium, and N-hexyl-pyridinium cations, pyrimidinium cations, such as, for example, 1-hexyl-3-propyl-pyrimidinium, 1-ethyl-3-methyl-pyrimidinium cations, pyrrolidinium cations, such as, for example, 1-butyl-1-methyl-pyrrolidinium and 1-methyl-1-propyl-pyrrolidinium cations, pyrrolium cations, such as, for example, 1,1-dimethyl-pyrrolium, 1-methyl-1-pentyl-pyrrolium cations, pyrrolinium cations, sulfonium cations, such as, for example, trimethyl sulfonium cations, thiazolium cations, oxazolium cations, and triazolium cations.

Typical anions for suitable ionic liquid compounds include, for example:

borate anions, such as, for example, tetrafluoroborate, tetracyanoborate, tetrakis-(p-(dimethyl(1H,1H,2H,2H-perfluorooctyl)silyl)phenyl)borate, alkyltrifluoroborate, perfluoroalkyltrifluoroborate, and alkenyltrifluoroborate anions carbonate anions such as, for example, hydrogen carbonate and methylcarbonate anions, carboxylate anions, such as, for example, salicylate, thiosalicylate, L-lactate, acetate, trifluoroacetate, and formate anions, chlorate anions, cyanate anions, such as, for example, thiocyanate, dicyanamide, and tricyanomethane anions, halide anions, such as, for example, fluoride, chloride, bromide, and iodide anions, imide anions, such as, for example, imide and bis(fluoromethylsulfonyl)imide anions, nitrate anions, phosphate anions, such as, for example, dihydrogen phosphate, hexafluorophosphate, di(trifluoromethyl)tetrafluorophosphate, tris(trifluoromethyl)trifluorophosphate, tris(perfluoroalkyl)trifluorophosphate, tetra(trifluoromethyl)difluorophosphate, penta(trifluoromethyl)fluorphosphate, and hexa(trifluoromethylphosphate anions, sulfate and sulfonate anions, such as, for example, trifluoromethanesulfonate, hydrogen sulfate, tosylate, $(C_1$-$C_{12})$ alkylsulfate, and $(C_1$-$C_{12})$alkylsulfonate anions, perfluoroalkyl β-diketonate anions, such as, for example, 6,6,7,7,8,8,8-heptafluoro-2,2-dimethyl-3,5-octanedionate, 1,1,1,5,5,5-hexafluoro-2,4-pentanedionate, and 4,4,4-trifluoro-1-(2-thienyl)-1,3-butanedionate anions, fluorohydrogenate anions, such as, for example, poly(hydrogen fluoride) fluoride anions, and fluorometallate anions, such as, for example, oxopentafluorotungstan (VI) anions.

The ionic liquid may comprise a mixture of ionic liquid compounds and thus a mixture of two or more of such cations and/or two or more of such anions.

The cation and anion of the ionic liquid are selected, according to techniques known in the art, to tailor the properties of the ionic liquid to suit the demands of the particular application, for example an ionic liquid with an imidazolium cation would typically be expected to provide lower viscosity and higher conductivity, but lower stability, than an analogous ionic liquid with ammonium or pyrrolidium cation, and an ionic liquid with a smaller anion, such as dicyanamide and tetracyanoborate anions, would typically be expected to provide higher conductivity, but lower stability, than an analogous ionic liquid with a larger anion, such as a tris(pentafluoroethyl)trifluorophosphate anion.

In one embodiment, the ionic liquid is an ionic compound that has a melting point of less than or equal to 25° C., such as, for example, 1-ethyl-3-methyl-imidazolium tetrachloroaluminate, 1-butyl-3-methyl-imidazolium tetrachloroaluminate, 1-ethyl-3-methyl-imidazolium acetate, 1-butyl-3-methyl-imidazolium acetate, 1-ethyl-3-methyl-imidazolium ethylsulfate, 1-butyl-3-methyl-imidazolium methylsulfate, 1-ethyl-3-methyl-imidazolium thiocyanate, 1-butyl-3-methyl-imidazolium thiocyanate, 1-ethyl-3-methyl-imidazolium bis(trifluoromethanesulfonyl)imide, 1-ethyl-3-methyl-imidazolium tetracyanoborate, 1-butyl-1-methylpyrrolidinium dicyanamide, 1-ethyl-3-methyl-imidazolium tetrafluoroborate, 1-ethyl-3-methyl-imidazolium trifluoroacetate, 1-ethyl-3-methyl-imidazolium bis(fluoromethylsulfonyl)imide, and mixtures thereof.

In one embodiment, the ionic liquid is an ionic compound that has a melting point of less than 25° C., a viscosity at 20° C. of less than or equal to about 100 centiPoise, and a specific conductance of greater than or equal to about 5 milliSiemens per centimeter ("mS/cm"), more typically greater than 10 mS/cm, such as, for example, 1-ethyl-3-methyl-imidazolium tetracyanoborate, 1-butyl-1-methyl-pyrrolidinium dicyanamide, 1-ethyl-3-methyl-imidazolium tetrafluoroborate, 1-ethyl-3-methyl-imidazolium thiocyanate, 1-ethyl-3-methyl-imidazolium trifluoroacetate, and 1-ethyl-3-methyl-imidazolium bis(fluoromethylsulfonyl)imide, and mixtures thereof.

In one embodiment, the ionic liquid comprises a salt of an alkyl-, hydroxyalkyl- and/or aryl-substituted imidazolium cation and a cyanate anion, such as, for example, 1,3-dimethyl-imidazolium dicyanate, 1-benzyl-3-methyl-imidazolium thiocyanate, 1-butyl-3-methyl-imidazolium tricyanomethane, 1-ethyl-3-methyl-imidazolium dicyanate, 1-hexyl-3-methyl-imidazolium thiocyanate, 1-methyl-3-propyl-imidazolium tricyanomethane, 1-methyl-3-octyl-imidazolium dicyanate, 1-methyl-3-tetradecyl-imidazolium thiocyanate, 1-methyl-3-phenyl-imidazolium dicyanate, 1,2,3-trimethyl-imidazolium thiocyanate, 1,2-methyl-3-octyl-imidazolium tricyanomethane, 1-butyl-2,3-dimethyl-imidazolium dicyanate, 1-hexyl-2,3-methyl-imidazolium thiocyanate, and 1-(2-hydroxyethyl)-2,3-dimethyl-imidazolium tricyanomethane, and mixtures thereof.

In one embodiment, the ionic liquid comprises a salt of an alkyl-, hydroxyalkyl- and/or aryl-substituted imidazolium cation and a tetracyanoborate anion, such as, for example, 1,3-dimethyl-imidazolium tetracyanoborate, 1-benzyl-3-methyl-imidazolium tetracyanoborate, 1-butyl-3-methyl-imidazolium tetracyanoborate, 1-ethyl-3-methyl-imidazolium tetracyanoborate, 1-hexyl-3-methyl-imidazolium tetracyanoborate, 1-methyl-3-propyl-imidazolium tetracyanoborate, 1-methyl-3-octyl-imidazolium tetracyanoborate, 1-methyl-3-tetradecyl-imidazolium tetracyanoborate, 1-methyl-3-phenyl-imidazolium tetracyanoborate, 1,2,3-trimethyl-imidazolium tetracyanoborate, 1,2-methyl-3-octyl-imidazolium tetracyanoborate, 1-butyl-2,3-dimethyl-imidazolium tetracyanoborate, 1-hexyl-2,3-methyl-imidazolium tetracyanoborate, and 1-(2-hydroxyethyl)-2,3-dimethyl-imidazolium tetracyanoborate, and mixtures thereof.

In one embodiment, the ionic liquid comprises a salt of an alkyl-, hydroxyalkyl- and/or aryl-substituted imidazolium cation and a tetrakis-(p-(dimethyl(1H,1H,2H,2H-perfluorooctyl)silyl)phenyl)borate anion, such as, for example, 1,3-dimethyl-imidazolium tetrakis-(p-(dimethyl(1H,1H,2H,2H-perfluorooctyl)silyl)phenyl)borate, 1-benzyl-3-methyl-imidazolium tetrakis-(p-(dimethyl(1H,1H,2H,2H-perfluorooctyl)silyl)phenyl)borate, 1-butyl-3-methyl-imidazolium tetrakis-(p-(dimethyl(1H,1H,2H,2H-perfluorooctyl)silyl)phenyl)borate, 1-ethyl-3-methyl-imidazolium tetrakis-(p-(dimethyl(1H,1H,2H,2H-perfluorooctyl)silyl)phenyl)borate, 1-hexyl-3-methyl-imidazolium tetrakis-(p-(dimethyl(1H,1H,2H,2H-perfluorooctyl)silyl)phenyl)borate, 1-methyl-3-propyl-imidazolium tetrakis-(p-(dimethyl(1H,1H,2H,2H-perfluorooctyl)silyl)phenyl)borate, 1-methyl-3-octyl-imidazolium tetrakis-(p-(dimethyl(1H,1H,2H,2H-perfluorooctyl)silyl)phenyl)borate, 1-methyl-3-tetradecyl-imidazolium tetrakis-(p-(dimethyl(1H,1H,2H,2H-perfluorooctyl)silyl)phenyl)borate, 1-methyl-3-phenyl-imidazolium tetrakis-(p-(dimethyl(1H,1H,2H,2H-perfluorooctyl)silyl)phenyl)borate, 1,2,3-trimethyl-imidazolium tetrakis-(p-(dimethyl(1H,1H,2H,2H-perfluorooctyl)silyl)phenyl)borate, 1,2-methyl-3-octyl-imidazolium tetrakis-(p-(dimethyl(1H,1H,2H,2H-perfluorooctyl)silyl)phenyl)borate, 1-butyl-2,3-dimethyl-imidazolium tetrakis-(p-(dimethyl(1H,1H,2H,2H-perfluorooctyl)silyl)phenyl)borate, 1-hexyl-2,3-methyl-imidazolium tetrakis-(p-(dimethyl(1H,1H,2H,2H-perfluorooctyl)silyl)phenyl)borate, and 1-(2-hydroxyethyl)-2,3-dimethyl-imidazolium tetrakis-(p-(dimethyl(1H,1H,2H,2H-perfluorooctyl)silyl)phenyl)borate, and mixtures thereof.

In one embodiment, the ionic liquid comprises a salt of an alkyl-, hydroxyalkyl- and/or aryl-substituted imidazolium cation and a hexafluorophosphate anion, such as, for example, 1,3-dimethyl-imidazolium hexyluorophosphate, 1-benzyl-3-methyl-imidazolium hexyluorophosphate, 1-butyl-3-methyl-imidazolium hexyluorophosphate, 1-ethyl-3-methyl-imidazolium hexyluorophosphate, 1-hexyl-3-methyl-imidazolium hexyluorophosphate, 1-methyl-3-propyl-imidazolium hexyluorophosphate, 1-methyl-3-octyl-imidazolium hexyluorophosphate, 1-methyl-3-tetradecyl-imidazolium hexyluorophosphate, 1-methyl-3-phenyl-imidazolium hexyluorophosphate, 1,2,3-trimethyl-imidazolium hexyluorophosphate, 1,2-methyl-3-octyl-imidazolium hexyluorophosphate, 1-butyl-2,3-dimethyl-imidazolium hexyluorophosphate, 1-hexyl-2,3-methyl-imidazolium hexyluorophosphate, and 1-(2-hydroxyethyl)-2,3-dimethyl-imidazolium hexyluorophosphate, and mixtures thereof.

As mentioned above, U.S. Pat. No. 7,438,832, issued Oct. 21, 2008 broadly discloses mixtures of electrically conductive polymers and ionic liquids, including specifically, mixtures of PEDOT-PSS and 1-butyl-3-methyl-imidazolium tetrafluoroborate. In one embodiment, wherein the electrically conductive polymer component of the respective polymer film, polymer composition, and/or electronic device of the present invention comprises a blend of a poly(thiophene) polymer and a water soluble acid polymer, or more typically of poly(3,4-ethylenedioxythiophene) and poly(styrene sulfonic acid), the ionic liquid component of such polymer film, polymer composition, and/or electronic device does not comprise 1-butyl-3-methyl-imidazolium tetrafluoroborate, or, more typically the ionic liquid component of such polymer film, polymer composition, and/or electronic device does not comprise a tetrafluoroborate anion.

In one embodiment, the ionic liquid component of the respective polymer film, polymer composition, and/or electronic device of the present invention does not comprise a tetrafluoroborate anion.

As mentioned above, U.S. Pat. No. 7,842,197, issued Nov. 30, 2010, discloses a method for producing a conductive material by contacting an electrically conductive polymer with certain ionic liquids, including specifically, contacting PEDOT-PSS and iodidated 1-hexyl-3-methylimidazolium or bis(trifluoromethane sulfonic acid)imide 1-ethyl-3-methyl-imidazolium. In one embodiment, wherein the electrically conductive polymer component of the respective polymer film, polymer gel, polymer foam, polymer composition, and/or electronic device of the present invention is a blend of a poly(thiophene) polymer and a water soluble acid polymer, the ionic liquid component of such polymer film, polymer composition, and/or electronic device does not comprise iodidated 1-hexyl-3-methylimidazolium or bis(trifluoromethane sulfonic acid)imide 1-ethyl-3-methylimidazolium, more typically does not comprise a para-toluene sulfonate anion, tetrafluoroborate anion, bis(trifluoromethylsulfonyl)imide anion, $(CF_3SO_3)^-$ anion, $(CH_3CH_2CH_2CH_2SO_3)^-$ anion, or $(CHF_2CF_2CF_2CF_2CH_2SO_3)^-$ anion, and, even more typically, does not comprise a sulfonate anion, sulfate anion, carboxylate anion, bis(trifluoromethylsulfonyl)imide anion, nitrate anion, nitro anion, halogen anion, $PF_6^-$ anion, or tetrafluoroborate anion.

In one embodiment, ionic liquid component of the respective polymer film, polymer gel, polymer foam, polymer composition, and/or electronic device of the present invention does not comprise a sulfonate anion, tetrafluoroborate anion, sulfonylimide anion, bis(trifluoromethylsulfonyl)imide anion, more typically the ionic liquid component of the respective polymer film, polymer gel, polymer foam, polymer composition, and/or electronic device of the present invention does not comprise a sulfonate anion, sulfate anion, carboxylate anion, bis(trifluoromethylsulfonyl)imide anion, nitrate anion, nitro anion, halogen anion, $PF_6^-$ anion, or tetrafluoroborate anion.

The respective polymer composition, polymer film, and polymer film component of the electronic device of the present invention may each optionally further comprise one or more additional components, such as, for example one or more of polymers, dyes, coating aids, conductive particles, conductive inks, conductive pastes, charge transport materials, crosslinking agents, and combinations thereof, that are dissolved or dispersed in the liquid carrier.

The polymer composition, polymer film, and polymer film component of the electronic device of the present invention may each optionally further comprise one or more electrically conductive additives, such as, for example, metal particles, including metal nanoparticles and metal nanowires, graphite particles, including graphite fibers, or carbon particles, including carbon fullerenes and carbon nanotubes, and as well as combinations of any such additives. Suitable fullerenes include for example, C60, C70, and C84 fullerenes, each of which may be derivatized, for example with a (3-methoxycarbonyl)-propyl-phenyl ("PCBM") group, such as C60-PCBM, C-70-PCBM and C-84 PCBM derivatized fullerenes. Suitable carbon nanotubes include single wall carbon nanotubes having an armchair, zigzag or chiral structure, as well as multiwall carbon nanotubes, including double wall carbon nanotubes, and mixtures thereof.

In one embodiment, the respective polymer film of the present invention and polymer film component of the electronic device of the present invention further each comprise up to about 65 pbw, more typically from about 12 to about 62 pbw carbon particles, more typically carbon nanotubes, and even more typically multi-wall carbon nanotubes, per 100 pbw of the film.

In one embodiment, the polymer composition of the present invention is made by providing a solution or dispersion of the electrically conductive polymer in the liquid carrier or dissolving or dispersing the electrically conductive polymer in the liquid carrier and dissolving or dispersing the ionic liquid in the liquid carrier, typically by adding the electrically conductive polymer and ionic liquid to the liquid carrier and agitating the mixture, more typically by providing a solution or dispersion of an electrically conductive polymer in a liquid carrier and dissolving or dispersing an ionic liquid in the solution or dispersion of the electrically conductive polymer in the liquid carrier.

In one embodiment, the ionic liquid is added to a quiescent, that is, without mixing, aqueous solution or dispersion of the electrically conductive polymer in the liquid carrier and then mixed. In another embodiment, an aqueous solution or dispersion of electrically conductive polymer in the liquid carrier is mixed and the ionic liquid is added to the aqueous dispersion of the electrically conductive polymer in the liquid carrier with continued mixing. In forming gel versions of the composition of the present invention, adding ionic liquid to a quiescent aqueous solution or dispersion of the electrically conductive polymer in the liquid carrier and then mixing tends to result in immediate gelation, while mixing the aqueous solution or dispersion of electrically conductive polymer in the liquid carrier and adding the ionic liquid to the aqueous dispersion of the electrically conductive polymer in the liquid carrier with continued mixing tends to delay gelation.

In one embodiment, an electrically conductive polymer film according to the present invention is made from the polymer composition of the present invention by depositing a layer of the polymer composition by, for example, casting, spray coating, spin coating, gravure coating, curtain coating, dip coating, slot-die coating, ink jet printing, gravure printing, or screen printing, on a substrate and removing the liquid carrier from the layer. Typically, the liquid carrier is removed from the layer by allowing the liquid carrier component of the layer to evaporate. The substrate supported layer may be subjected to elevated temperature to encourage evaporation of the liquid carrier.

The substrate may be rigid or flexible and may comprise, for example, a metal, a polymer, a glass, a paper, or a ceramic material. In one embodiment, the substrate is a flexible plastic sheet. In one embodiment, the substrate is a flexible plastic sheets comprising a polymer selected from polyesters, polysulfones, polyethersulfones, polyarylates, polyimides, polyetherimides, polytetrafluoroethylenes, poly(ether ketone)s, poly(ether ether ketone)s, poly((meth)acrylate)s, polycarbonates, polyolefins, and mixture thereof.

The polymer film may cover an area of the substrate that is as large as an entire electronic device or as small as a specific functional area such as the actual visual display, or as small as a single sub-pixel. In one embodiment, the polymer film has a thickness of from greater than 0 to about 10 μm, more typically from 0 to about 50 nm.

In an alternative embodiment, the polymer film of the present invention is made by contacting a film of electrically conductive polymer, typically supported on a substrate, with the ionic liquid. The polymer film may be contacted with the ionic liquid by, for example, immersing the polymer film in a volume of the ionic liquid or by applying a layer of the ionic liquid to a surface of the film, such as, for example, by spray application. The time and temperature of contacting may be determined on a case by case basis, depending upon the identity of polymer, the identity of the ionic liquid, the geometry of the film, and the desired result. Typically the contacting is conducted at room temperature or at an elevated temperature, typically of up to about 100° C. The contact time may be any non-zero contact time, more typically the contact time is from about 1 minute to about one hour. Following the contacting step, any excess ionic liquid may be removed by washing the polymer film with a suitable liquid medium, such as for example, water, an organic solvent, or a mixture of water and water miscible organic solvent.

In one embodiment, the polymer film of the present invention is not redispersible in the liquid carrier, and the film can thus be applied as a series of multiple thin films. In addition, the film can be overcoated with a layer of different material dispersed in the liquid carrier without being damaged.

In one embodiment, the electrically conductive foam of the present invention is made by contacting, in an aqueous liquid medium, the electrically conductive polymer with an amount of ionic liquid effective to gel the electrically conductive polymer, and removing the aqueous liquid medium from the gel to form the polymer foam. In one embodiment, the liquid medium is removed form the gel by freeze-drying the gel.

In one embodiment, the polymer composition of the present invention comprises, based on 100 pbw of the polymer composition:
(a) from greater than 0 to less than 100 pbw, more typically from about 50 to less than 100 pbw, even more typically from about 90 to about 99.5 pbw of a liquid carrier,
(b) from greater than 0 to less than 100 pbw, more typically from greater than 0 to about 50 pbw, even more typically from 0.5 to about 10 pbw, of an electrically conductive polymer and an ionic liquid, comprising, based on 100 pbw of the total amount of the electrically conductive polymer and the ionic liquid,
  (i) from about 1 to about 99.9 pbw, more typically from about 2 to about 99.9 pbw, and even more typically from about 25 to about 80 pbw of the electrically conductive polymer, said electrically conductive polymer comprising, based on 100 pbw of the electrically conductive polymer:
    (1) from greater than 0 pbw to 100 pbw, more typically from about 10 to about 50 pbw, and even more typically from about 20 to about 50 pbw of one or more electrically conductive polymers, more typically one or more electrically conductive polymers comprising monomeric units according to structure (I.a), even more typically one or more polythiophene polymers comprising monomeric units according to structure (I.a) wherein Q is S, and even more typically one or more electrically conductive polymers comprising poly(3,4-ethylenedioxythiophene), and
    (2) from 0 pbw to 100 pbw, more typically from about 50 to about 90 pbw, and even more typically from about 50 to about 80 pbw, of one or more water soluble polymer acid dopants, more typically of one or more water soluble polymer acid dopants comprising a poly(styrene sulfonic acid) dopant, and
  (ii) from about 0.1 to about 99 pbw, more typically from about 0.1 to about 97.5 pbw, and even more typically from about 20 to about 75 pbw of the ionic liquid, said ionic liquid comprising a cyanate anion, a tetracyanoborate anion, a tetrakis-(p-(dimethyl(1H,1H,2H,2H-per-fluorooctyl)silyl)phenyl)borate anion, or a hexafluorophosphate anion, more typically comprising a salt of an alkyl-, hydroxyalkyl-, and/or aryl-substituted imidazolium cation and a cyanate anion, a tetracyanoborate anion, a tetrakis-(p-(dimethyl(1H,1H,2H,2H-per-fluorooctyl)silyl)phenyl)borate anion, or a hexafluorophosphate anion, and even more typically comprising 1-ethyl-3-methyl-imidazolium dicyanate, 1-ethyl-3-methyl-imidazolium tetracyanoborate, 1-ethyl-3-methyl-imidazolium tetrakis-(p-(dimethyl(1H,1H,2H,2H-per-fluorooctyl)silyl)phenyl)borate anion, or 1-ethyl-3-methyl-imidazolium tetracyanoborate hexafluorophosphate, even more typically 1-ethyl-3-methyl-imidazolium tetracyanoborate.

In one embodiment, the respective polymer film the present invention and/or polymer film component of the electronic device of the present invention each comprise, based on 100 pbw of the polymer film:
(a) from about 1 to about 99.9 pbw, more typically from about 2 to about 99.9 pbw, and even more typically from about 10 to about 80 pbw of an electrically conductive polymer, said electrically conductive polymer comprising, based on 100 pbw of the electrically conductive polymer:
  (1) from greater than 0 pbw to 100 pbw, more typically from about 10 to about 50 pbw, and even more typically from about 20 to about 50 pbw of one or more electrically conductive polymers, more typically one or more electrically conductive polymers comprising monomeric units according to structure (I.a), more typically one or more polythiophene polymers comprising monomeric units according to structure (I.a) wherein Q is S, and even more typically, one or more electrically conductive polymers comprising poly(3,4-ethylenedioxythiophene), and
  (2) from 0 pbw to 100 pbw, more typically from about 50 to about 90 pbw, and even more typically from about 50 to about 80 pbw, of one or more water soluble polymer acid dopants, more typically of one or more water soluble polymer acid dopants comprising a poly(styrene sulfonic acid) dopant, and
(b) from about 0.1 to about 99 pbw, more typically from about 0.1 to about 97.5 pbw, and even more typically from about 20 to about 90 pbw of an ionic liquid, said ionic liquid comprising a cyanate anion, a tetracyanoborate anion, a tetrakis-(p-(dimethyl(1H,1H,2H,2H-per-fluorooctyl)silyl)phenyl)borate anion, or a hexafluorophosphate anion, more typically comprising a salt of an alkyl-, hydroxyalkyl-, and/or aryl-substituted imidazolium cation and a cyanate anion, a tetracyanoborate anion, a tetrakis-(p-(dimethyl(1H,1H,2H,2H-per-fluorooctyl)silyl)phenyl) borate anion, or a hexafluorophosphate anion, and even more typically comprising 1-ethyl-3-methyl-imidazolium dicyanate, 1-ethyl-3-methyl-imidazolium tetracyanoborate, 1-ethyl-3-methyl-imidazolium tetrakis-(p-(dimethyl(1H,1H,2H,2H-per-fluorooctyl)silyl)phenyl)borate anion, or 1-ethyl-3-methyl-imidazolium tetracyanoborate hexafluorophosphate, even more typically 1-ethyl-3-methyl-imidazolium tetracyanoborate.

In one embodiment, the respective polymer film of the present invention and/or polymer film component of the electronic device of the present invention each comprise, based on 100 pbw of the polymer film:
(a) from about 10 to about 80 pbw of an electrically conductive polymer, comprising, based on 100 pbw of the electrically conductive polymer:
  (1) from about 20 to about 50 pbw of poly(3,4-ethylenedioxythiophene), and
  (2) from about 50 to about 80 pbw of poly(styrene sulfonic acid) dopant, and
(b) from about 20 to about 90 pbw of an ionic liquid comprising 1-ethyl-3-methyl-imidazolium dicyanate, 1-ethyl-3-methyl-imidazolium tetracyanoborate, 1-ethyl-3-methyl-imidazolium tetrakis-(p-(dimethyl(1H,1H,2H,2H-per-fluorooctyl)silyl)phenyl)borate anion, or 1-ethyl-3-methyl-imidazolium tetracyanoborate hexafluorophosphate, even more typically 1-ethyl-3-methyl-imidazolium tetracyanoborate.

The polymer film according to the present invention typically exhibits high conductivity and high optical transparency and is useful as a layer in an electronic device in which the high conductivity is desired in combination with optical transparency.

In one embodiment, the respective polymer film of the present invention and/or polymer film component of the electronic device of the present invention each exhibit a sheet resistance of less than or equal to 500 Ohms per square ("Ω/☐"). In another embodiment, the respective polymer film of the present invention and polymer film component of the electronic device of the present invention each exhibit a sheet resistance of less than or equal to 300Ω/☐. In another embodiment, the respective polymer film of the present invention and polymer film component of the electronic device of the present invention each exhibit a sheet resistance of less than or equal to 200Ω/☐, more typically less than or equal to 100Ω/☐. The polymer film of the present invention exhibits the above described sheet resistance values even in the absence of electrically conductive particles, such as metal particles, graphite particles or carbon particles, and the sheet resistance of the polymer film may be further reduced by addition of such electrically conductive particles. In one embodiment, a polymer film that consists essentially of (that is, in the absence of any electrically conductive particles) a mixture of the electrically conductive polymer and the ionic liquid exhibits sheet resistance of less than or equal to 500Ω/☐, or less than or equal to 300Ω/☐, or less than or equal to 200Ω/☐. In one embodiment, a polymer film that consists of a mixture of the electrically conductive polymer and the ionic liquid exhibits a sheet resistance of less than or equal to 500Ω/☐, or less than or equal to 300Ω/☐, or less than or equal to 200 Ω/☐.

In one embodiment, the respective polymer film of the present invention and/or polymer film component of the electronic device of the present invention each exhibit an optical transmittance at 550 nm of greater than or equal to 90%, more typically greater than or equal to 93%, even more typically greater than or equal to 95%, and still more typically of greater than or equal to 98%.

In one embodiment, the respective polymer film of the present invention and/or polymer film component of the electronic device of the present invention each exhibit a sheet resistance of less than or equal to 500Ω/☐, or less than or equal to 300Ω/☐, or less than or equal to 200Ω/☐, or less than or equal to 100Ω/☐, and an optical transmittance at 550 nm of greater than or equal to 90%, more typically greater than or equal to 93%, even more typically greater than or equal to 95% and still more typically of greater than or equal to 98%.

In one embodiment, the respective polymer film of the present invention and/or polymer film component of the electronic device of the present invention each exhibit a conductivity of greater than or equal to 500 Siemens per centimeter ("S/cm"), more typically greater than or equal to 1000 S/cm, even more typically greater than or equal to 1500 S/cm, and still more typically greater than or equal to 2000 S/cm. The conductivity of the film is calculated according to formula (I):

$$\sigma = 1/\rho_s t \quad (1)$$

wherein:
σ is the conductivity of the film, in Siemens per centimeter ("S/cm"),
$\rho_s$ is the sheet resistance of the film, in Ohms per square ("Ω/☐"), and
t is the thickness of the film, in centimeters ("cm").

The polymer film of the present invention exhibits the above described conductivity values even in the absence of electrically conductive particles, such as metal particles, graphite particles or carbon particles, and the conductivity of the polymer film may be further reduced by addition of such electrically conductive particles. In one embodiment, a polymer film that consists essentially of (that is, in the absence of any electrically conductive particles) a mixture of the electrically conductive polymer and the ionic liquid exhibits conductivity of greater than or equal to 500 S/cm or greater than or equal to 1000 S/cm, or greater than or equal to 1500 S/cm or greater than or equal to 2000 S/cm. In one embodiment, a polymer film that consists of a mixture of the electrically conductive polymer and the ionic liquid exhibits a conductivity of greater than or equal to 500 S/cm or greater than or equal to 1000 S/cm, or greater than or equal to 1500 S/cm or greater than or equal to 2000 S/cm.

In one embodiment, the respective polymer film of the present invention and/or polymer film component of the electronic device of the present invention each exhibit a conductivity of greater than or equal to 500 S/cm or greater than or equal to 1000 S/cm, or greater than or equal to 1500 S/cm or greater than or equal to 2000 S/cm, and an optical transmittance at 550 nm of greater than or equal to 90%, more typically greater than or equal to 93%, even more typically greater than or equal to 95% and still more typically of greater than or equal to 98%.

In one embodiment, the aqueous gel of the present invention comprises, based on 100 pbw of the gel,
(A) from about 2 pbw to about 90 pbw of a polymer network, based on 100 pbw of the polymer network:
  (i) from about 10 to about 40 pbw, more typically from about 15 to about 35 pbw, and even more typically from about 20 to about 35 pbw of an electrically conductive polymer comprising a mixture of, based on 100 pbw of the mixture:
    (1) from about 20 to about 50 pbw of poly(3,4-ethylenedioxythiophene), and
    (2) from about 50 to about 80 pbw of poly(styrene sulfonic acid) dopant, and
  (ii) from about 60 to about 90 pbw, more typically from about 65 to about 85 pbw, and even more typically from about 65 to about 80 pbw of an ionic liquid comprising 1-ethyl-3-methyl-imidazolium tetracyanoborate,
(B) from about 10 pbw to about 98 pbw of an aqueous liquid medium, wherein the ratio of the total amount by weight of the ionic liquid in such film to the total amount by weight of the electrically conductive polymer in such film is typically from about 1.5:1 to about 45:1, more typically from 1.7:1 to 20:1, even more typically from about 1.7:1 to about 10:1, and still more typically from 2:1 to 8:1.

In one embodiment, the polymer foam of the present invention and polymer foam component of the electronic device of the present invention each comprise the product obtained by contacting, based on 100 pbw of the polymer foam:
  (i) from about 10 to about 40 pbw, more typically from about 15 to about 35 pbw, and even more typically from about 20 to about 35 pbw of an electrically conductive polymer comprising a mixture of, based on 100 pbw of the mixture:
    (1) from about 20 to about 50 pbw of poly(3,4-ethylenedioxythiophene), and
    (2) from about 50 to about 80 pbw of poly(styrene sulfonic acid) dopant, and
  (ii) from about 60 to about 90 pbw, more typically from about 65 to about 85 pbw, and even more typically from about 65 to about 80 pbw of an ionic liquid comprising 1-ethyl-3-methyl-imidazolium tetracyanoborate,
wherein the ratio of the total amount by weight of the ionic liquid in such film to the total amount by weight of the electrically conductive polymer in such film is typically from about 1.5:1 to about 45:1, more typically from 1.7:1 to 20:1, even more typically from about 1.7:1 to about 10:1, and still more typically from 2:1 to 8:1.

In one embodiment, the respective polymer gel of the present invention and polymer gel component of the electronic device of the present invention each exhibit a sheet resistance of less than or equal to 50Ω/□, more typically, of less than or equal to 10Ω/□.

In one embodiment, polymer film according to the present invention is used as an electrode layer, more typically, an anode layer, of an electronic device.

In one embodiment, the polymer film according to the present invention is used as a buffer layer of an electronic device.

In one embodiment, a polymer film according to the present invention is used as a combined electrode and buffer layer, typically a combined anode and buffer layer, of an electronic device.

In one embodiment, the electronic device of the present invention is an electronic device 100, as shown in FIG. 1, having an anode layer 101, an electroactive layer 104, and a cathode layer 106 and optionally further having a buffer layer 102, hole transport layer 103, and/or electron injection/transport layer or confinement layer 105, wherein at least one of the layers of the device is a polymer film according to the present invention. The device 100 may further include a support or substrate (not shown), that can be adjacent to the anode layer 101 or the cathode layer 106, more typically, adjacent to the anode layer 101. The support can be flexible or rigid, organic or inorganic. Suitable support materials include, for example, glass, ceramic, metal, and plastic films.

In one embodiment, anode layer 101 of device 100 comprises a polymer film according to the present invention. The polymer film of the present invention is particularly suitable as anode layer 106 of device 100 because of its high electrical conductivity.

In one embodiment, anode layer 101 itself has a multilayer structure and comprises a layer of the polymer film according to the present invention, typically as the top layer of the multilayer anode, and one or more additional layers, each comprising a metal, mixed metal, alloy, metal oxide, or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 101 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 101 include, but are not limited to, indium-tin-oxide, indium-zinc-oxide, aluminum-tin-oxide, gold, silver, copper, and nickel. The mixed oxide layer may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include radio frequency magnetron sputtering and inductively-coupled plasma physical vapor deposition ("IMP-PVD"). These deposition techniques are well known within the semiconductor fabrication arts.

In one embodiment, the mixed oxide layer is patterned. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used.

In one embodiment, device 100 comprises a buffer layer 102 and the buffer layer 102 comprises a polymer film according to the present invention.

In one embodiment, a separate buffer layer 102 is absent and anode layer 101 functions as a combined anode and buffer layer. In one embodiment, the combined anode/buffer layer 101 comprises a polymer film according to the present invention.

In some embodiments, optional hole transport layer 103 is present, either between anode layer 101 and electroactive layer 104, or, in those embodiments that comprise buffer layer 102, between buffer layer 102 and electroactive layer 104. Hole transport layer 103 may comprise one or more hole transporting molecules and/or polymers. Commonly used hole transporting molecules include, but are not limited to: 4,4',4"-tris(N,N-diphenyl-amino)-triphenylamine, 4,4',4"-tris(N-3-methylphenyl-N-phenyl-amino)-triphenylamine, N,N'-diphenyl-N,N'-bis(3-methylphenyl)-(1,1'-biphenyl)-4,4'-diamine, 1,1-bis((di-4-tolylamino)phenyl) cyclohexane, N,N'-bis(4-methylphenyl)-N,N'-bis(4-ethylphenyl)-(1,1'-(3,3'-dimethyl)biphenyl)-4,4'-diamine, tetrakis-(3-methylphenyl)-N,N,N',N'-2,5-phenylenediamine, .alpha-phenyl-4-N,N-diphenylaminostyrene, p-(diethylamino)benzaldehyde diphenylhydrazone, triphenylamine, bis(4-(N,N-diethylamino)-2-methylphenyl)(4-methylphenyl)methane, 1-phenyl-3-(p-(diethylamino) styryl)-5-(p-(diethylamino)phenyl)pyrazoline, 1,2-trans-bis (9H-carbazol-9-yl)cyclobutane, N,N,N',N'-tetrakis(4-methylphenyl)-(1,1'-biphenyl)-4,4'-diamine, N,N'-bis (naphthalen-1-yl)-N,N'-bis-(phenyl)benzidine, and porphyrinic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules, such as those mentioned above, into polymers such as polystyrene and polycarbonate.

The composition of electroactive layer 104 depends on the intended function of device 100, for example, electroactive layer 104 can be a light-emitting layer that is activated by an applied voltage (such as in a light-emitting diode or light-emitting electrochemical cell), or a layer of material that responds to radiant energy and generates a signal with or without an applied bias voltage (such as in a photodetector). In one embodiment, electroactive layer 104 comprises an organic electroluminescent ("EL") material, such as, for example, electroluminescent small molecule organic compounds, electroluminescent metal complexes, and electroluminescent conjugated polymers, as well as mixtures thereof. Suitable EL small molecule organic compounds include, for example, pyrene, perylene, rubrene, and coumarin, as well as derivatives thereof and mixtures thereof. Suitable EL metal complexes include, for example, metal chelated oxinoid compounds, such as tris(8-hydroxyquinolate)aluminum, cyclo-metallated iridium and platinum electroluminescent compounds, such as complexes of iridium with phenylpyridine, phenylquinoline, or phenylpyrimidine ligands as disclosed in Petrov et al., U.S. Pat. No. 6,670,645, and organometallic complexes such as those described in, for example, Published PCT Applications WO 03/008424, as well as mixtures any of such EL metal complexes. Examples of EL conjugated polymers include, but are not limited to poly(phenylenevinylenes), polyfluorenes, poly (spirobifluorenes), polythiophenes, and poly(p-phenylenes), as well as copolymers thereof and mixtures thereof.

Optional layer 105 can function as an electron injection/transport layer and/or a confinement layer. More specifically, layer 105 may promote electron mobility and reduce the likelihood of a quenching reaction if layers 104 and 106 would otherwise be in direct contact. Examples of materials suitable for optional layer 105 include, for example, metal chelated oxinoid compounds, such as bis(2-methyl-8-quinolinolato)(para-phenyl-phenolato)aluminum(III) and tris(8-hydroxyquinolato)aluminum, tetrakis(8-hydroxyquinolinato)zirconium, azole compounds such as 2-(4-biphenylyl)-5-(4-t-butylphenyl)-1,3,4-oxadiazole, 3-(4-biphenylyl)-4-phenyl-5-(4-t-butylphenyl)-1,2,4-triazole, and 1,3,5-tri (phenyl-2-benzimidazole)benzene, quinoxaline derivatives such as 2,3-bis(4-fluorophenyl)quinoxaline, phenanthroline derivatives such as 9,10-diphenylphenanthroline and 2,9-dimethyl-4,7-diphenyl-1,10-phenanthroline, and as well as mixtures thereof. Alternatively, optional layer 105 may comprise an inorganic material, such as, for example, BaO, LiF, $Li_2O$.

Cathode layer 106 can be any metal or nonmetal having a lower work function than anode layer 101. In one embodiment, anode layer 101 has a work function of greater than or equal to about 4.4 eV and cathode layer 106 has a work function less than about 4.4 eV. Materials suitable for use as cathode layer 106 are known in the art and include, for example, alkali metals of Group 1, such as Li, Na, K, Rb, and Cs, Group 2 metals, such as, Mg, Ca, Ba, Group 12 metals, lanthanides such as Ce, Sm, and Eu, and actinides, as well as aluminum, indium, yttrium, and combinations of any such materials. Specific non-limiting examples of materials suitable for cathode layer 106 include, but are not limited to, Barium, Lithium, Cerium, Cesium, Europium, Rubidium, Yttrium, Magnesium, Samarium, and alloys and combinations thereof. Cathode layer 106 is typically formed by a chemical or physical vapor deposition process. In some embodiments, the cathode layer will be patterned, as discussed above in reference to the anode layer 101.

In one embodiment, an encapsulation layer (not shown) is deposited over cathode layer 106 to prevent entry of undesirable components, such as water and oxygen, into device 100. Such components can have a deleterious effect on electroactive layer 104. In one embodiment, the encapsulation layer is a barrier layer or film. In one embodiment, the encapsulation layer is a glass lid.

Though not shown in FIG. 1, it is understood that device 100 may comprise additional layers. Other layers that are known in the art or otherwise may be used. In addition, any of the above-described layers may comprise two or more sub-layers or may form a laminar structure. Alternatively, some or all of anode layer 101, buffer layer 102, hole transport layer 103, electron transport layer 105, cathode layer 106, and any additional layers may be treated, especially surface treated, to increase charge carrier transport efficiency or other physical properties of the devices. The choice of materials for each of the component layers is preferably determined by balancing the goals of providing a device with high device efficiency with device operational lifetime considerations, fabrication time and complexity factors and other considerations appreciated by persons skilled in the art. It will be appreciated that determining optimal components, component configurations, and compositional identities would be routine to those of ordinary skill of in the art.

The various layers of the electronic device can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing. Other layers in the device can be made of any materials which are known to be useful in such layers upon consideration of the function to be served by such layers.

In one embodiment of the device 100, the different layers have the following range of thicknesses:

anode layer 101, typically 500-5000 Angstroms ("Å"), more typically, 1000-2000 Å, optional buffer layer 102: typically 50-2000 Å, more typically, 200-1000 Å, optional hole transport layer 103: typically 50-2000 Å, more typically, 100-1000 Å, photoactive layer 104: typically, 10-2000 Å, more typically, 100-1000 Å, optional electron transport layer: typically 105, 50-2000 Å, more typically, 100-1000 Å, and cathode layer 106: typically 200-10000 Å, more typically, 300-5000 Å.

As is known in the art, the location of the electron-hole recombination zone in the device, and thus the emission spectrum of the device, can be affected by the relative thickness of each layer. The appropriate ratio of layer thicknesses will depend on the exact nature of the device and the materials used.

In one embodiment, the electronic device of the present invention, comprises:

(a) an anode or combined anode and buffer layer 101, (b) a cathode layer 106, (c) an electroactive layer 104, disposed between anode layer 101 and cathode layer 106, (d) optionally, a buffer layer 102, typically disposed between anode layer 101 and electroactive layer 104, (e) optionally, a hole transport layer 105, typically disposed between anode layer 101 and electroactive layer 104, or if buffer layer 102 is present, between buffer layer 102 and electroactive layer 104, and (f) optionally an electron injection layer 105, typically disposed between electroactive layer 104 and cathode layer 106, wherein at least one of the layers of the device, typically at least one of the anode or combined anode and buffer layer 101 and, if present, buffer layer 102, comprises a polymer film according to the present invention.

The electronic device of the present invention may be any device that comprises one or more layers of semiconductor materials and makes use of the controlled motion of electrons through such one or more layers, such as, for example:

a device that converts electrical energy into radiation, such as, for example, a light-emitting diode, light emitting diode display, diode laser, a liquid crystal display, or lighting panel, a device that detects signals through electronic processes, such as, for example, a photodetector, photoconductive cell, photoresistor, photoswitch, phototransistor, phototube, infrared ("IR") detector, biosensor, or a touch screen display device, a device that converts radiation into electrical energy, such as, for example, a photovoltaic device or solar cell, and a device that includes one or more electronic components with one or more semiconductor layers, such as, for example, a transistor or diode.

In one embodiment, the electronic device of the present invention is a device for converting electrical energy into radiation, and comprises an anode 101 that comprises a polymer film according to the present invention, a cathode layer 106, an electroactive layer 104 that is capable of converting electrical energy into radiation, disposed between the anode layer 101 layer and the cathode layer 106, and optionally further comprising a buffer layer 102, a hole transport layer 103, and/or an electron injection layer 105. In one embodiment, the device is a light emitting diode ("LED") device and the electroactive layer 104 of the device is an electroluminescent material, even more typically, and the device is an organic light emitting diode ("OLED") device and the electroactive layer 104 of the device is organic electroluminescent material. In one embodiment, the OLED device is an "active matrix" OLED display, wherein, individual deposits of photoactive organic films may be independently excited by the passage of current, leading to individual pixels of light emission. In another embodiment, the OLED is a "passive matrix" OLED display, wherein deposits of photoactive organic films may be excited by rows and columns of electrical contact layers.

In one embodiment, the electronic device of the present invention is a device for converting radiation into electrical energy, and comprises an anode 101 that comprises a polymer film according to the present invention, a cathode layer 106, an electroactive layer 104 comprising a material that is capable of converting radiation into electrical energy, disposed between the anode layer 101 layer and the cathode layer 106, and optionally further comprising a buffer layer 102, a hole transport layer 103, and/or an electron injection layer 105.

In operation of one embodiment of device 100, such as a device for converting electrical energy into radiation, a voltage from an appropriate power supply (not depicted) is applied to device 100 so that an electrical current passes across the layers of the device 100 and electrons enter electroactive layer 104, and are converted into radiation, such as in the case of an electroluminescent device, a release of photon from electroactive layer 104.

In operation of another embodiment of device 100, such as device for converting radiation into electrical energy, device 100 is exposed to radiation impinges on electroactive layer 104, and is converted into a flow of electrical current across the layers of the device.

In one embodiment, the electronic device 100 is a battery comprising an anode 101, a cathode layer 106 and an electrolyte layer 104 disposed between the anode layer and cathode layer, wherein the electrolyte layer 104 comprises a polymer film according to the present invention, in the form of an aqueous gel.

In one embodiment, the electronic device 100 comprises an electroactive layer 104, wherein the electroactive layer 104 comprises a polymer foam according to the present invention.

Examples 1-13 and Comparative Examples C1-C26

The compositions of Examples 1-4 and Comparative Examples C1-C20 were made by mixing the components listed below:

| | |
|---|---|
| PEDOT:PSS 1 | Aqueous dispersion containing 1.3 percent by weight ("wt %") of poly(3,4-ethylenedioxythiophene:poly(styrene sulfonic acid) blend (Low Conductive (Sigma Aldrich)) |
| PEDOT:PSS 2 | Aqueous dispersion containing 1.3 wt % of poly(3,4-ethylenedioxythiophene: poly(styrene sulfonic acid) blend (Clevios PH 750 (H. C. Starck)) |
| PEDOT:PSS 3 | Aqueous dispersion containing 1.3 wt % of poly(3,4-ethylenedioxythiophene: poly(styrene sulfonic acid) blend (Clevios PH 1000 (H.C. Starck)) |
| DMSO | Dimethyl sulfoxide (Sigma Aldrich) |
| EG | Ethylene glycol (VWR) |
| DMF | Dimethyl formamide (Sigma Aldrich) |
| IL 1 | 1-ethyl-3-methylimidazolium tetracyanoborate (Merck) | in the relative amounts set forth in TABLES I-III below. The compositions were each spin-coated on plastic substrates (100 microLiter ("μL") aliquot of the respective composition on a 1.5×1.5 centimeter ("cm") at 380 revolutions per minute ("rpm") for 18 seconds and then at 3990 rpm for 1 minute) to form a film of the composition. Two spin-coated samples were each dried in the oven for 1 hour and were then each dried at room temperature.

The resistance of each of the spin-coated films was measured between two electrodes of silver paste on opposite sides of a theoretical square, using a multimeter. The optical transmittance of the spin-coated films were characterized with a Cary 100 Bio UV-Visible spectrophotometer. The sheet resistance, in units of Ohms per square ("Ω/□"), and transmittance in the range of 300-800 nm, in units of percent transmittance (%), for each sample are set forth in TABLES IA, IB, IIA, IIB, IIIA, IIIB, and IV below.

TABLE IA

| | Example # | | | | | | |
|---|---|---|---|---|---|---|---|
| | 1 | 2 | 3 | 4 | 5 | 6 | 7 |
| PEDOT:PSS 1 | 99.58 | 99.06 | 97.89 | 97.37 | 97.03 | — | — |
| PEDOT:PSS 2 | — | — | — | — | — | 99.49 | 98.79 |
| PEDOT:PSS 3 | — | — | — | — | — | — | — |
| IL 1 | 0.42 | 0.94 | 2.11 | 2.63 | 2.97 | 0.51 | 1.21 |
| Resistance (Ω/□) | 329000 | 9350 | 1130 | 435 | 434 | 108000 | 262 |
| Transmittance (%) | >98 | >98 | >98 | >98 | >98 | >98 | >98 |

TABLE IB

| | Example # | | | | | |
|---|---|---|---|---|---|---|
| | 8 | 9 | 10 | 11 | 12 | 13 |
| PEDOT:PSS 1 | — | — | — | — | — | — |
| PEDOT:PSS 2 | 97.91 | 97.44 | 96.82 | — | — | — |
| PEDOT:PSS 3 | — | — | — | 99 | 98 | 97.34 |
| IL 1 | 2.09 | 2.56 | 3.18 | 1 | 2 | 2.66 |
| Resistance (Ω/□) | 135 | 175 | 77 | 108 | 84 | 52 |

TABLE IB-continued

| | Example # | | | | | |
|---|---|---|---|---|---|---|
| | 8 | 9 | 10 | 11 | 12 | 13 |
| Transmittance (%) | >98 | >98 | >98 | >98 | >98 | >98 |

TABLE IIA

| | Comparative Example # | | | | | | |
|---|---|---|---|---|---|---|---|
| | C1 | C2 | C3 | C4 | C5 | C6 | C7 |
| PEDOT:PSS 1 | 100 | 98.60 | 99.05 | 99 | 94.66 | 94.86 | 95.39 |
| DMSO | — | 1.40 | — | — | 5.34 | — | — |
| EG | — | — | 0.95 | — | — | 5.14 | — |
| DMF | — | — | — | 1 | — | — | 4.61 |
| Resistance (Ω/□) | 1480000 | 88500 | 343000 | 428000 | 1140 | 2070 | 5320 |
| Transmittance (%) | >98 | >98 | >98 | >98 | >98 | >98 | >98 |

TABLE IIB

| | Comparative Example # | | | | | |
|---|---|---|---|---|---|---|
| | C8 | C9 | C10 | C11 | C12 | C13 |
| PEDOT:PSS 1 | 89.57 | 89.63 | 90.11 | 78.3 | 80.56 | 80.08 |
| DMSO | 10.43 | — | 21.7 | — | — | — |
| EG | — | 10.37 | — | 19.44 | — | — |
| DMF | — | — | 9.89 | — | — | 19.92 |
| Resistance (Ω/□) | 890 | 1550 | 1140 | 1000 | 798 | 1340 |
| Transmittance (%) | >98 | >98 | >98 | >98 | >98 | >98 |

TABLE IIIA

| | Comparative Example # | | | | | | |
|---|---|---|---|---|---|---|---|
| | C14 | C15 | C16 | C17 | C18 | C19 | C20 |
| PEDOT:PSS 2 | 100 | 98.75 | 98.82 | 98.83 | 95.12 | 92.85 | 94.9 |
| DMSO | — | 1.25 | — | — | 4.88 | — | — |
| EG | — | — | 1.18 | — | — | 7.15 | — |
| DMF | — | — | — | 1.17 | — | — | 5.10 |
| Resistance (Ω/□) | 545000 | 39000 | 178000 | 135000 | 566 | 295 | 996 |
| Transmittance (%) | >98 | >98 | >98 | >98 | >98 | >98 | >98 |

TABLE IIIB

| | Comparative Example # | | | | | |
|---|---|---|---|---|---|---|
| | C21 | C22 | C23 | C24 | C25 | C26 |
| PEDOT:PSS 2 | 90.02 | 89.89 | 90.04 | 80.28 | 80.09 | 80.16 |
| DMSO | 9.98 | — | — | 19.72 | — | — |
| EG | — | 10.11 | — | — | 19.91 | — |
| DMF | — | — | 9.96 | — | — | 19.84 |
| Resistance (Ω/□) | 307 | 372 | 393 | 284 | 243 | 316 |
| Transmittance (%) | >98 | >98 | >98 | >98 | >98 | >98 |

TABLE IV

| | Comparative Example # | | | |
|---|---|---|---|---|
| | C27 | C28 | C29 | C30 |
| PEDOT:PSS 3 | 100 | 98.87 | 95.16 | 89.98 |
| DMSO | — | 1.13 | 4.84 | 10.02 |
| Resistance (Ω/□) | 315000 | 21200 | 199 | 168 |
| Transmittance (%) | >98 | >98 | >98 | >98 |

Examples 14-24 and Comparative Example C31

The compositions of Examples 14 to 24 and Comparative Example C31 were made as follows. In each case, ionic liquid (ethyl-3-methylimidazolium tetracyanoborate (melting point 13° C., EMD Chemicals) was added, in the respective amount set forth below in TABLE V, to 1 gram of a 1.3 wt % aqueous dispersion of PEDOT:PSS (Clevios PH 1000 H.C. Starck) and mixed.

The viscosity of the dispersions increased with increasing the amount of ionic liquid. At a ratio of 1.7 pbw ionic liquid per 1 pbw PEDOT:PSS polymer solids, the composition began to show evidence of gelation and a complete gel was formed at a ratio of 2 pbw ionic liquid per 1 pbw PEDOT:PSS polymer solids. Gels were formed up to a ratio of about 45 pbw ionic liquid per 1 pbw PEDOT:PSS polymer solids. Compositions comprising a ratio of greater than about 45 pbw ionic liquid per 1 pbw PEDOT:PSS polymer solids formed conductive pastes.

A 100 microliter aliquot of each of the respective liquid compositions of Examples 14, 15, 16, and 17 and Comparative Example C31 was spin coated on a plastic sheet at 380 revolutions per minutes ("rpm") for 18 seconds and then 3990 rpm for 1 minute to form a film. The spin coated films were dried in the oven at 120° C. for 20 minutes each and then stored at room temperature.

Each of the gels obtained in the compositions of Examples 18 to 24 was freeze dried. Porous compressible foam structures, having a roughly right circular cylindrical shape of roughly 1.5 mm in diameter and from 0.4 to 3.5 mm in height, were obtained. The foams were not soluble in water when subjected to (i) mechanical stirring for more than one day, (ii) sonication for more than one hour, or (iii) heating up to 60° C. The foams were flexible and deformable under low compressive force, for example, finger pressure, and recovered their initial shape after the compressive force was removed.

The resistance of each spin coated film was measured between two electrodes of silver paste on opposite sides of a theoretical square, using a millimeter. The sheet resistance values (in Ohms per square ("Ω/□")) exhibited by each the films of Examples 14-17 and Comparative Example 31 are set forth in TABLES VA and VB below. The resistance of each of the foams of Examples 18 to 24, was measured directly by compressing the foam and using a multimeter, and in each case was found to be in the range of about 50 to about 1000, depending on the thickness of the compressed foam.

Examples 25-34

The compositions of Examples 25 to 29 were made by adding an ionic liquid (1-Ethyl-3-methylimidazolium dicyanamide ("EMIM N(CN)2")), in the respective amounts set forth below in TABLE VI, to 1 gram of a 1.3 wt % aqueous dispersion of PEDOT:PSS (Clevios PH 1000 H.C. Starck) and mixing.

The compositions of Examples 30-34 were made by adding an ionic liquid (1-Ethyl-3-methylimidazolium hexafluorophosphate ("EMIM PF6")), in the respective amounts set forth below in TABLE VII, to 1 gram of a 1.3 wt % aqueous dispersion of PEDOT:PSS (Clevios PH 1000 H.C. Starck) and mixing.

A 100 microliter aliquot of each of the respective liquid compositions of Examples 25 to 34 was spin coated on a plastic sheet at 380 revolutions per minutes ("rpm") for 18 seconds and then 3990 rpm for 1 minute to form a film. The spin coated films were dried in the oven at 120° C. for 20 minutes each and then stored at room temperature. The resistance of each spin coated film was measured between two electrodes of silver paste on opposite sides of a theoretical square, using a millimeter. The amount ionic liquid (expressed as grams ("g") ionic liquid per 0.013 g PEDOT:PSS polymer) in each aqueous polymer/ionic liquid dispersion, the ratio (wt:wt) of ionic liquid to PEDOT:PSS polymer in the aqueous polymer/ionic liquid dispersion and film, the physical state of the aqueous polymer/ionic liquid dispersion, and the sheet resistance of the film (in Ohms per square ("Ω/□")), for each of Examples 25 to 34 are set forth in the respective TABLES VI and VII below.

TABLE VA

| | Example # | | | | | |
|---|---|---|---|---|---|---|
| | C31 | 14 | 15 | 16 | 17 | 18 |
| Amount ionic liquid (g) per 0.013 g PEDOT:PSS polymer | 0 | 0.0054 | 0.01 | 0.176 | 0.02 | 0.022 |
| Ratio (wt:wt) of ionic liquid to PEDOT:PSS polymer | No ionic liquid | 0.42 | 0.77 | 1.31 | 1.54 | 1.69 |
| Physical State | liquid | liquid | liquid | liquid | Liquid | gel |
| Resistance (Ω/□) | 300,000 | 2,000 | 100 | 60 | 35 | — |

TABLE VB

| | Example # | | | | | |
|---|---|---|---|---|---|---|
| | 19 | 20 | 21 | 22 | 23 | 24 |
| Amount ionic liquid (g) per 0.013 g PEDOT:PSS polymer | 0.0298 | 0.0358 | 0.1 | 0.16 | 0.21 | 0.52 |
| Ratio (wt:wt) of ionic liquid to PEDOT:PSS polymer | 2.28 | 2.75 | 7.69 | 12.41 | 15.87 | 40.16 |
| Physical State | gel | gel | gel | gel | gel | gel |
| Resistance (Ω/□) | — | — | — | — | — | — |

TABLE VI

| EMIM N(CN)2 | Example # | | | | |
|---|---|---|---|---|---|
| | 25 | 26 | 27 | 28 | 29 |
| Amount ionic liquid (g) per 0.013 g PEDOT:PSS polymer | 0.00620 | 0.0087 | 0.0105 | 0.0116 | 0.0145 |
| Ratio (wt:wt) of ionic liquid to PEDOT:PSS polymer | 0.477 | 0.669 | 0.808 | 0.892 | 1.115 |
| Physical state | liquid | liquid | liquid | liquid | liquid |
| Resistance (Ω/□)) | 155900 | 45700 | 10380 | 650 | 418 |

TABLE VII

| Ionic liquid = EMIM PF6 | Example # | | | | |
|---|---|---|---|---|---|
| | 30 | 31 | 32 | 33 | 34 |
| Amount ionic liquid (g) per 0.013 g PEDOT:PSS polymer | 0.0060 | 0.0089 | 0.0258 | 0.0240 | 0.0401 |
| Ratio (wt:wt) of ionic liquid to PEDOT:PSS polymer | 0.462 | 0.685 | 1.985 | 1.846 | 3.085 |
| Physical state | liquid | liquid | liquid | liquid | liquid |
| Resistance (Ω/□) | 1260000 | 193800 | 2680 | 239 | 244 |

Examples 35 to 43 and Comparative Examples C32 to C36

The compositions of Examples 35 to 38 were made by adding an ionic liquid (1-Ethyl-3-methylimidazolium tetracyanoborate ("EMIM TCB")), in the respective amounts set forth below in TABLE VIII, to 1 gram of a 1.3 wt % aqueous dispersion of PEDOT:PSS (Clevios PH 1000 H.C. Starck), without stirring the dispersion during the addition and then stirring (Process 1 "P1")).

The compositions of Examples 39 to 43 were made by adding an ionic liquid (1-Ethyl-3-methylimidazolium tetracyanoborate ("EMIM TCB")), in the respective amounts set forth below in TABLE IX, to 1 gram of a 1.3 wt % aqueous dispersion of PEDOT:PSS (Clevios PH 1000 H.C. Starck) while stirring the dispersion, with continued stirring (Process 2 "P2")).

The compositions of Comparative Examples C32 to C36 were made by adding an ionic liquid (1-Ethyl-3-methylimidazolium tetrafluoroborate ("EMIM BF4")), in the respective amount set forth below in TABLE X, to 1 gram of a 1.3 wt % aqueous dispersion of PEDOT:PSS (Clevios PH 1000 H.C. Starck) while stirring the dispersion, with continued stirring (Process 2 "P2")).

A 100 microliter aliquot of each of the respective liquid compositions of Examples 35 to 43 and Comparative Examples C32 to C36 was spin coated on a glass sheet at 380 revolutions per minutes ("rpm") for 18 seconds and then 3990 rpm for 1 minute to form a film. The spin coated films were dried in the oven at 120° C. for 20 minutes each and then stored at room temperature. The resistance of each spin coated film was measured between two electrodes of silver paste on opposite sides of a theoretical square, using a millimeter. The thickness of each film was measured using an alpha-SE™ spectroscopic ellipsometer (J. A. Wollam & Co., Inc.). The conductivity of each film was calculated according to formula (I), as described above.

The amount ionic liquid (expressed as grams ("g") ionic liquid per 0.013 g PEDOT:PSS polymer) in each aqueous polymer/ionic liquid dispersion, the ratio (wt:wt) of ionic liquid to PEDOT:PSS polymer in the aqueous polymer/ionic liquid dispersion and film, the physical state of the aqueous polymer/ionic liquid dispersion, the resistance (in ohm/sq) of the film, sheet resistance values (in Ohms per square ("Ω/□")) the amount of ionic liquid in film (as percent by weigh ("wt %") of the film), the thickness of the film (in nanometers ("nm")), and the conductivity (in Siemens per centimeter ("S/cm")) for each of Examples 35 to 43 and Comparative Examples C32 to C36 are set forth in the respective TABLES VIII, IX, and X below.

TABLE VIII

| EMIM TCB, | Example # | | | |
|---|---|---|---|---|
| added directly | 35 | 36 | 37 | 38 |
| Amount ionic liquid (g) per 0.013 g PEDOT:PSS polymer | 0 | 0.00600 | 0.0094 | 0.0159 |
| Ratio (wt:wt) of ionic liquid to PEDOT:PSS polymer | 0 | 0.462 | 0.723 | 1.223 |
| Physical state | liquid | liquid | liquid | liquid |
| Resistance (Ω/□) | 235000 | 237 | 148 | 50 |
| wt % EMIM TCB in film | 0 | 31 | 42 | 55 |
| Thickness (nm) | 61 | 61 | 74 | 96 |
| Conductivity (S/cm) | 0.68 | 811 | 933 | 2083 |

TABLE IX

| EMIM TCB, added while stirring | Example # | | | | |
|---|---|---|---|---|---|
| | 39 | 40 | 41 | 42 | 43 |
| Amount ionic liquid (g) per 0.013 g PEDOT:PSS polymer | 0 | 0.00470 | 0.0079 | 0.0127 | 0.0167 |
| Ratio (wt:wt) of ionic liquid to PEDOT:PSS polymer | 0 | 0.362 | 0.608 | 0.977 | 1.285 |
| Physical state | liquid | liquid | liquid | liquid | liquid |
| Resistance (Ω/□) | 235000 | 184 | 99 | 86 | 69 |
| wt % EMIM TCB in film | 0 | 27 | 37 | 50 | 56 |
| Thickness (nm) | 61 | 78 | 107 | 194 | 235 |
| Conductivity (S/cm) | 0.68 | 699 | 941 | 596 | 621 |

TABLE X

| BMIM BF4, added while stirring | Example # | | | |
|---|---|---|---|---|
| | C32 | C33 | C34 | C36 |
| Amount ionic liquid (g) per 0.013 g PEDOT:PSS polymer | 0 | 0.0064 | 0.0092 | 0.0133 |
| Ratio (wt:wt) of ionic liquid to PEDOT:PSS polymer (%) | 0 | 0.49 | 0.71 | 1.02 |
| Physical state | liquid | liquid | liquid | liquid |
| Resistance (Ω/□) | 235000 | 351100 | 2650 | 110 |
| wt % EMIM TCB in film | 0 | 32 | 41 | 50 |
| Thickness (nm) | 61 | 115 | 200 | 317 |
| Conductivity (S/cm) | 0.68 | 0.25 | 19 | 287 |

Figure 2:
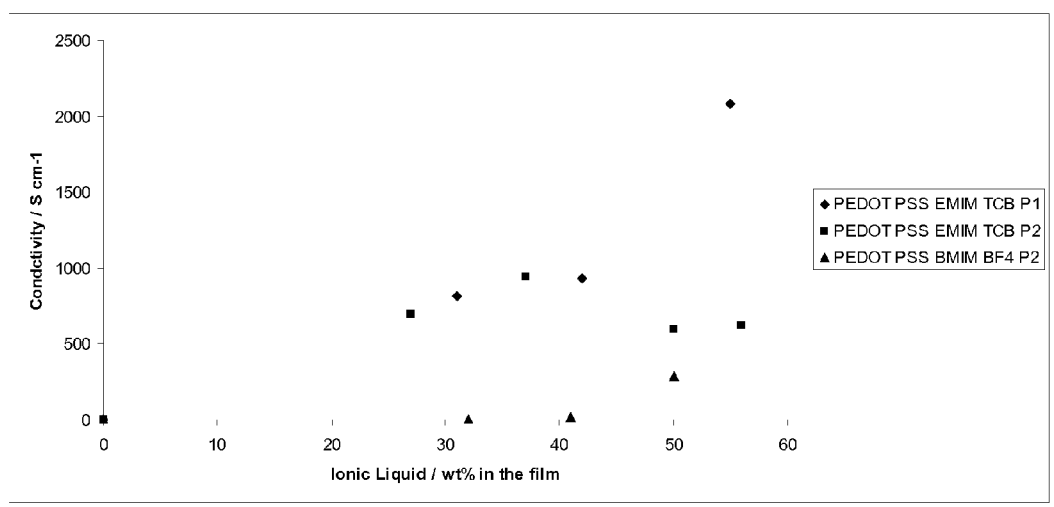
FIG. 2 is a plot of Conductivity, expressed in Siemens per centimeter ("S cm$^{-1}$") versus amount of ionic liquid in the film, expressed as percent by weight of the film ("wt %"), for the poly(3,4-ethylenedioxythiophene):poly(styrene sulfonic acid)/1-ethyl-3-methylimidazolium tetracyanoborate films of Examples 35 to 38, as described below ("PEDOT PSS EMIM TCB P1"), and Examples 39 to 43, as described below ("PEDOT PSS EMIM TCB P2"), and of the poly(3,4-ethylenedioxythiophene):poly(styrene sulfonic acid)/1-ethyl-3-methylimidazolium tetrafluoroborate films of Comparative Examples C32 to C36, as described below (("PEDOT PSS EMIM BF4 P2").

The conductivity of the PEDT:PSS/EMIM TCB films of Examples 39 to 43 ("PEDOT PSS EMIM TCB P2") was greater than the conductivity of the analogous PEDOT:PSS/EMIM TCB films of Examples 35 to 38 ("PEDOT PSS EMIM TCB P1"), as shown graphically in FIG. 2.

The conductivity of the PEDT:PSS/EMIM TCB films of Examples 39 to 43 ("PEDOT PSS EMIM TCB P2") was significantly greater than the conductivity of the analogous PEDOT:PSS/EMIM BF4 films of Comparative Examples C32 to C36 (("PEDOT PSS EMIM BF4 P2"), as shown graphically in FIG. 2.

What is claimed is:

1. A method for making a polymer composition, comprising:
    stirring a solution or dispersion of an electrically conductive polymer in a liquid carrier, and
    adding an ionic liquid to the solution or dispersion of the electrically conductive polymer in the liquid carrier while stirring the solution or dispersion of the electrically conductive polymer in the liquid carrier;
wherein:
    (a) the electrically conductive polymer comprises, based on 100 parts by weight of the electrically conductive polymer:
        (i) from about 20 to about 50 parts by weight of one or more electrically conductive polymers comprising poly(3,4-ethylenedioxythiophene), and
        (ii) from about 50 to about 80 parts by weight of one or more water soluble polymeric acid dopants comprising a poly(styrene sulfonic acid) dopant, and
    (b) the ionic liquid comprises 1-ethyl-3-methyl-imidazolium tetracyanoborate.

2. A method for making a polymer film, comprising:
    (A) forming a layer of a polymer composition, said polymer composition comprising
        (a) a liquid carrier,
        (b) one or more electrically conductive polymers dissolved or dispersed in the liquid carrier, said electrically conductive polymer comprising, based on 100 parts by weight of the electrically conductive polymer:
            (i) from about 20 to about 50 parts by weight of one or more electrically conductive polymers comprising poly(3,4-ethylenedioxythiophene), and
            (ii) from about 50 to about 80 parts by weight of one or more water soluble polymeric acid dopants comprising a poly(styrene sulfonic acid) dopant, and
        (c) one or more ionic liquids dissolved or dispersed in the liquid carrier, said one or more ionic liquids comprising 1-ethyl-3-methyl-imidazolium tetracyanoborate, and
    (B) removing the liquid carrier from the layer.

* * * * *